United States Patent [19]
Matsuoka

[11] Patent Number: 6,064,239
[45] Date of Patent: May 16, 2000

[54] CHOPPER-TYPE VOLTAGE COMPARATOR

[75] Inventor: Takashi Matsuoka, Tokyo, Japan

[73] Assignee: NEC Corporation, Tokyo, Japan

[21] Appl. No.: 09/097,808

[22] Filed: Jun. 16, 1998

[30] Foreign Application Priority Data

Jun. 17, 1997 [JP] Japan .................................. 9-160212

[51] Int. Cl.[7] .................................................. H03K 5/22
[52] U.S. Cl. .............................. 327/63; 327/78; 327/91; 327/215
[58] Field of Search ............................. 327/77, 78, 79, 327/63, 54, 55, 91, 215

[56] References Cited

U.S. PATENT DOCUMENTS

| | | | |
|---|---|---|---|
| 5,329,187 | 7/1994 | Crispie et al. | 327/65 |
| 5,821,780 | 10/1998 | Hasegawa | 327/63 |
| 5,869,987 | 2/1999 | Tang | 327/77 |

OTHER PUBLICATIONS

Noriyuki Fukushima et al., "A CMOS 40MHz 8b 105mW Two–Step ADC", *1989 IEEE International Solid–State Circuits Conference*, Feb. 15, 1989, pp. 14–15.

*Primary Examiner*—Kenneth B. Wells
*Assistant Examiner*—An T. Luu
*Attorney, Agent, or Firm*—Sughrue, Mion, Zinn, Macpeak & Seas, PLLC

[57] ABSTRACT

A differential input chopper-type voltage comparator for comparing an input voltage signal and a reference voltage signal and outputting a comparison result is provided. The voltage comparator contains an input voltage terminal, a reference voltage terminal, and a comparing circuit. The input voltage terminal inputs the input voltage signal, and the reference voltage terminal inputs the reference voltage signal. The comparing circuit is coupled to the input voltage terminal and the reference voltage terminal, and simultaneously inputs the input voltage signal and the reference voltage signal. Also, the comparing circuit simultaneously processes the input voltage signal and the reference signal, outputs a first predetermined voltage signal as the comparison result if the input voltage signal is greater than the reference voltage signal, and outputs a second predetermined voltage signal as the comparison result if the input voltage signal is less than the reference voltage signal. Also a method performed by the apparatus is also provided.

56 Claims, 12 Drawing Sheets

COMP_OUT VS ENCODER_OUT

| COMP1 | COMP2 | COMP3 | COMP4 | COMP5 | COMP6 | COMP7 | ENC OUT |
|---|---|---|---|---|---|---|---|
| 0 | 0 | 0 | 0 | 0 | 0 | 0 | 000 |
| 0 | 0 | 0 | 0 | 0 | 0 | 1 | 001 |
| 0 | 0 | 0 | 0 | 0 | 1 | 1 | 010 |
| 0 | 0 | 0 | 0 | 1 | 1 | 1 | 011 |
| 0 | 0 | 0 | 1 | 1 | 1 | 1 | 100 |
| 0 | 0 | 1 | 1 | 1 | 1 | 1 | 101 |
| 0 | 1 | 1 | 1 | 1 | 1 | 1 | 110 |
| 1 | 1 | 1 | 1 | 1 | 1 | 1 | 111 |

$V_① = V_{in}$ $V_④ = V_{ref}$ $V_② = V_③ = V_⑤ = V_⑥ = V_{LT}$ $V'_①=V'_④=(V_{in}+V_{ref})/2$ $V'_②=V_{LT}-\{(V_{in}-V_{ref})/2\}$ $V'_③=V_{LT}+\{A(V_{in}-V_{ref})/2\}$ $V'_⑤=V_{LT}+\{(V_{in}-V_{ref})/2\}$ $V'_⑥=V'_{LT}-\{A(V_{in}-V_{ref})/2\}$ $V'① = V'④ = (V_{in}+V_{ref})/2$ $V'② = V_{LT} - \{A^{n-1}(V_{in}-V_{ref})/2\}$ $V'③ = V_{LT} + \{A^n(V_{in}-V_{ref})/2\}$ $V'⑤ = V_{LT} + \{A^{n-1}(V_{in}-V_{ref})/2\}$ $V'⑥ = V'_{LT} - \{A^n(V_{in}-V_{ref})/2\}$

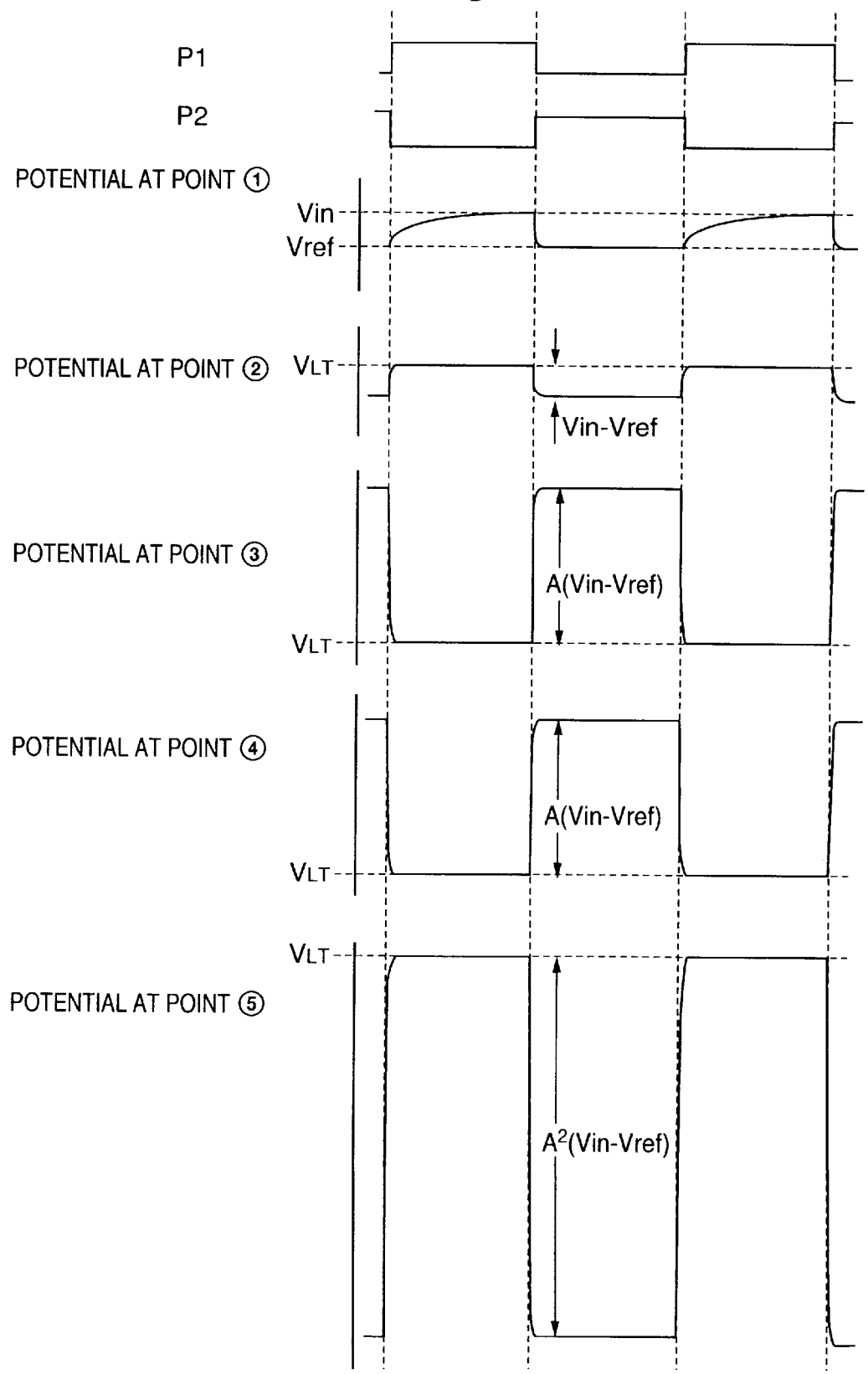

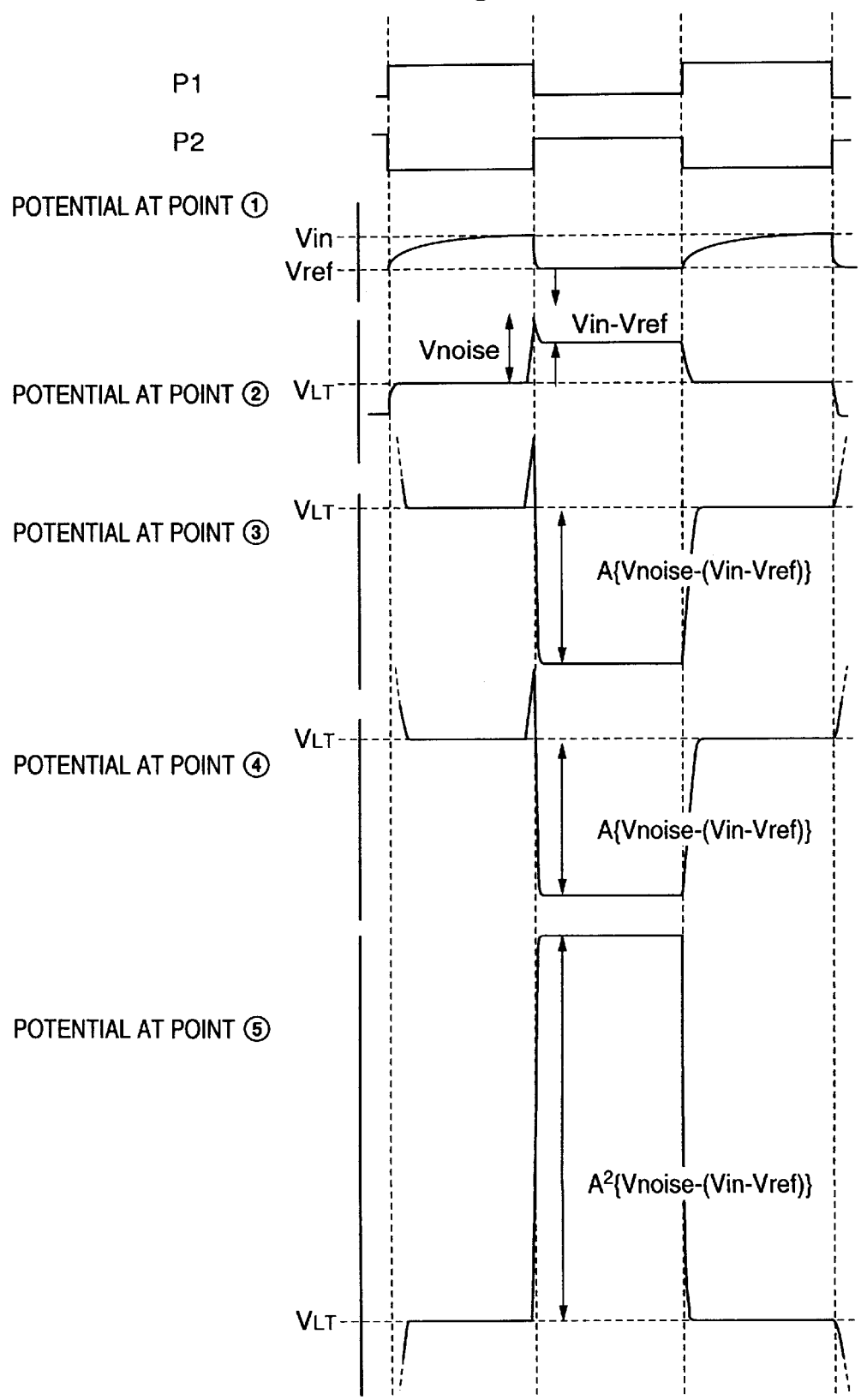

1st STAGE

2nd STAGE

3rd STAGE

4th STAGE

CHOPPER-TYPE VOLTAGE COMPARATOR

FIELD OF THE INVENTION

The present invention generally relates to an analog/digital ("A/D") converter. More particularly, the present invention relates to an A/D converter comprising a chopper-type voltage comparator.

BACKGROUND OF THE INVENTION

FIG. 9 illustrates a conventional chopper-type voltage comparator which is disclosed in N. Fukushima et al., "A CMOS 40 MHz 8b 105 mW Two-Step ADC", IEEE International Solid-State Circuits Conference, pp. 14–15, (1989). As shown in the figure, the conventional voltage comparator comprises an input voltage terminal 51, a reference voltage terminal 52, first to fourth switches 53, 54, 57, and 60, first and second capacitors 55 and 58, first and second inverters 56 and 59, and an output terminal 61.

The reference voltage terminal 52 inputs a reference voltage $V_{ref}$, and the voltage input terminal 51 inputs an input voltage $V_{in}$ to be compared with the reference voltage $V_{ref}$. A first terminal of the first switch 53 is connected to the input voltage terminal 51, and a first terminal of the second switch 54 is connected to the reference voltage terminal 52. A first terminal of the first capacitor 55 is connected to a second terminal of the first switch 53 and a second terminal of the second switch 54.

The input terminal of the first inverter 56 is connected to a second terminal of the first capacitor 55, and the output terminal of the inverter 56 is connected to a first terminal of the second capacitor 58. A first terminal of the third switch 57 is connected to the input terminal of the first inverter 56, and a second terminal of the switch 57 is connected to the output terminal of the inverter 56.

The input terminal of the second inverter 59 is connected to a second terminal of the second capacitor 58, and the output terminal of the inverter 59 is connected to the output terminal 61. A first terminal of the fourth switch 60 is connected to the input terminal of the second inverter 59, and a second terminal of the switch 60 is connected to the output terminal of the inverter 59.

Also, although not shown in the figure, the switches 53, 54, 57, and 60 are selectively turned ON (i.e. closed/rendered conductive) and turned OFF (i.e. opened/rendered non-conductive) via first and second drive signals P1 and P2. Specifically, when the first drive signal P1 is a logic "1", the first, third, and fourth switches 53, 57 and 60 are turned ON, and when the first drive signal PI is a logic "0", the switches 53, 57 and 60 are turned OFF. On the other hand, the second switch 54 is turned ON when the second drive signal P2 is a logic "1" and is turned OFF when the second drive signal P2 is a logic "0".

The comparing operation performed by the conventional chopper-type voltage comparator will be described with reference to FIG. 10. As shown in the figure, the voltage comparator operates in three stages. The first stage is defined when the first drive signal P1 equals "1" and the second drive signal P2 equals "0". The second stage is defined when the first drive signal P1 equals "0" and the second drive signal P2 equals "1". Finally, the third stage is defined when the first drive signal P1 again equals "1" and the second drive signal P2 again equals "0".

During the first stage (i.e. P1=1 and P2=0), the first, third, and fourth switches 53, 57, and 60 are closed, and the second switch 54 is opened. Thus, the input voltage $V_{in}$ is sampled and supplied to the first capacitor 55. Also, the third switch 57 connects the input and output terminals of the first inverter 56 so that the potential at the output terminal of the inverter 56 is held at a threshold voltage $V_{LT}$ of the inverter 56. Similarly, the fourth switch 57 connects the input and output terminals of the second inverter 59 so that the potential at the output terminal of the inverter 59 is held at the threshold voltage $V_{LT}$ of the inverter 59. In addition, the threshold voltages $V_{LT}$ of the inverters 56 and 59 are equal.

Therefore, as shown during the first stage in FIG. 10, the voltage at the first terminal of the first capacitor (i.e. at point 1) rises to the level of the input voltage $V_{in}$. Also, the voltages at the input terminal of the inverter 56 (i.e. at point 2) and at the output terminal of the inverter 56 (i.e. at point 3) both equal the threshold voltage $V_{LT}$. Similarly, the voltages at the input terminal of the inverter 59 (i.e. at point 4) and at the output terminal of the inverter 59 (i.e. at point 5) both equal the threshold voltage $V_{LT}$.

Then, during the second stage (i.e. P1=0 and P2=1), the second switch 54 is closed, and the first, third, and fourth switches 53, 57, and 60 are opened. As a result, the reference voltage $V_{ref}$ is applied to the first terminal of the first capacitor 55. At this moment, the voltage at the second terminal of the capacitor 55 (i.e. the voltage at the input terminal of the first inverter 56) changes from the threshold voltage $V_{LT}$ by an amount which equals the difference between the input voltage $V_{in}$ and the reference voltage $V_{ref}$ (i.e. changes by an amount $(V_{in}-V_{ref})$) In other words, the voltage at the input terminal of the inverter 56 equals $V_{LT}-(V_{in}-V_{ref})$. As a result, the inverter 56 outputs a voltage $V_{LT}+A(V_{in}-V_{ref})$ via its output terminal. Specifically, the inverter 56 inputs the voltage $V_{LT}-(V_{in}-V_{ref})$ from the first capacitor 55, subtracts its threshold voltage $V_{LT}$ from the voltage $V_{LT}-(V_{in}-V_{ref})$ to obtain the voltage $-(V_{in}-V_{ref})$, and amplifies the voltage $-(V_{in}-V_{ref})$ by an amplification factor $-A$ to obtain the voltage $A(V_{in}-V_{ref})$. Then, before the voltage $A(V_{in}-V_{ref})$ is output from the inverter 56, it is added to the threshold voltage $V_{LT}$ of the inverter 56 to obtain the voltage $V_{LT}+A(V_{in}-V_{ref})$. As a result, the voltage $V_{LT}+A(V_{in}-V_{ref})$ is present at the output terminal of the inverter 56 (i.e. at the point 3).

The voltage $V_{LT}+A(V_{in}-V_{ref})$ output from the first inverter 56 is applied via the second capacitor 58 to the input terminal of the second inverter 59 (i.e. applied to point 4). As a result, the inverter 59 outputs a voltage $V_{LT}-A^2(V_{in}-V_{ref})$ via its output terminal. Specifically, the inverter 59 inputs the voltage $V_{LT}+A(V_{in}-V_{ref})$ from the second capacitor 58, subtracts its threshold voltage $V_{LT}$ from the voltage $V_{LT}+A(V_{in}-V_{ref})$ to obtain the voltage $A(V_{in}-V_{ref})$, and amplifies the voltage $A(V_{in}-V_{ref})$ by an amplification factor $-A$ to obtain the voltage $-A^2(V_{in}-V_{ref})$. Then, before the voltage $-A^2(V_{in}-V_{ref})$ is output from the inverter 59, it is added to the threshold voltage $V_{LT}$ of the inverter 59 to obtain the voltage $V_{LT}-A^2(V_{in}-V_{ref})$. As a result, the voltage $V_{LT}A^2(V_{in}-V_{ref})$ is present at the output terminal of the inverter 59 (i.e. at point 5).

As illustrated above, the conventional chopper-type voltage comparator samples both the input voltage $V_{in}$ and the reference voltage $V_{ref}$ with the same capacitor 55 and adjusts the charge in the capacitor 55 based on the difference between the voltages $V_{in}$ and $V_{ref}$. Then, the voltage difference $(V_{in}-V_{ref})$ is amplified to a desired logic level in multiple stages by the inverters 56 and 57 to obtain a voltage comparison result (i.e. the voltage output from the output terminal 61).

The conventional chopper-type voltage comparator suffers from several problems. For example, although not illustrated in FIG. 9 for the sake of clarity, the conventional voltage comparator must have many more than two stages of inverters to obtain a voltage comparison result that has a high precision and/or a desired logic level. However, using many stages of inverters substantially increases the amount of current consumed by the comparator and the size of the comparator.

Also, the conventional voltage comparator will generate an erroneous voltage comparison result if the threshold voltage in one of the inverters changes as a result of common-mode noise such as power supply noise. In other words, the inverters are connected to a power supply, and any noise contained in the power supplied to the inverters will change their threshold voltages. Similar noises may also result from noise in the ground voltage. For instance, as shown in FIG. 11, a common-mode noise may be caused when a transition is made from a state in which the first drive signal P1 equals "1" and the second drive signal P2 equals "0" to a state in which the first drive signal P1 equals "0" and the second drive signal P2 equals "1". Such noise may change the threshold voltage of the inverter 56 and create an erroneous voltage comparison result if the change is larger than the difference between the input voltage $V_{in}$ and the reference voltage $V_{ref}$. In such case, a voltage comparison result, which is opposite to the correct voltage comparison result, is obtained. Thus, the incorrect relationship between the input voltage $V_{in}$ and the reference voltage $V_{ref}$ is indicated.

As shown in the second stage of the figure, the voltage of the noise $V_{NOISE}$ increases the voltage at the input terminal of the inverter 56 (i.e. at point 2) to a voltage $V_{LT}+(V_{NOISE}-(V_{in}-V_{ref}))$ instead of the current voltage $V_{LT}-(V_{in}-V_{ref})$. Thus, if the voltage $V_{NOISE}$ is greater than the voltage $(V_{in}-V_{ref})$, the voltage input to the inverter 56 will be greater than the threshold voltage $V_{LT}$ instead of being less than the threshold voltage $V_{LT}$ (see FIG. 10). As a result, the voltage $V_{LT}+A^2(V_{NOISE}-(V_{in}-V_{ref}))$ at the output terminal (i.e. at point 5) will be greater than the threshold voltage $V_{LT}$ instead of less than such voltage $V_{LT}$ (see FIG. 10). Thus, the voltage comparison result is incorrect.

SUMMARY OF THE INVENTION

An object of the present invention is to provide a chopper-type voltage comparator which consumes a small amount of power and has increased reliability.

In order to achieve the above and other objects, a differential input chopper-type voltage comparator for comparing an input voltage signal and a reference voltage signal and outputting a comparison result is provided. The voltage comparator comprises: an input voltage terminal which inputs said input voltage signal; a reference voltage terminal which inputs said reference voltage signal; a comparing circuit which is coupled to said input voltage terminal and said reference voltage terminal, which simultaneously inputs said input voltage signal and said reference voltage signal, and which simultaneously processes said input voltage signal and said reference signal, wherein said comparing circuit generates and outputs a first predetermined voltage signal as said comparison result if said input voltage signal is greater than said reference voltage signal, and wherein said comparing circuit generates and outputs a second predetermined voltage signal as said comparison result if said input voltage signal is less than said reference voltage signal.

In order to further achieve the above and other objects, a voltage comparing method is provided. The method comprises the steps of: (a) sampling an input voltage signal to obtain a sampled input voltage signal and sampling a reference voltage signal to obtain a sampled reference voltage signal; (b) obtaining a first voltage signal based on said sampled input voltage signal and said sampled reference voltage signal and obtaining a second voltage signal based on said sampled input voltage signal and said sampled reference voltage signal; (c) amplifying and inverting said first voltage signal to produce an amplified first voltage signal; (d) amplifying and inverting said second voltage signal to produce an amplified second voltage signal; and (e) supplying said amplified first voltage signal and said amplified second signal to a latch circuit which outputs a comparison result based on a first voltage of said first voltage signal and a second voltage of said second voltage signal.

BRIEF DESCRIPTION OF THE DRAWINGS

The above objects and advantages of the present invention will become more apparent by describing in detail preferred embodiments thereof with reference to the attached drawing in which:

FIG. 10 shows a waveform diagram of voltages at various points of the circuit diagram shown in FIG. 9 during a theoretical operation of the voltage comparator;

FIG. 11 shows a waveform diagram of voltages at various points of the circuit diagram shown in FIG. 9 during an actual operation of the voltage comparator in which common-mode noise is generated;

DETAILED DESCRIPTION OF THE PREFERRED EMBODIMENTS

The following description of the preferred embodiments discloses specific configurations and components. However, the preferred embodiments are merely examples of the present invention, and thus, the specific features described below are merely used to more easily describe such embodiments and to provide an overall understanding of the present invention. Accordingly, one skilled in the art will readily recognize that the present invention is not limited to the specific embodiments described below. Furthermore, the descriptions of various configurations and components of the present invention which would have been known to one skilled in the art are omitted for the sake of clarity and brevity.

Figures 1A, 1B:
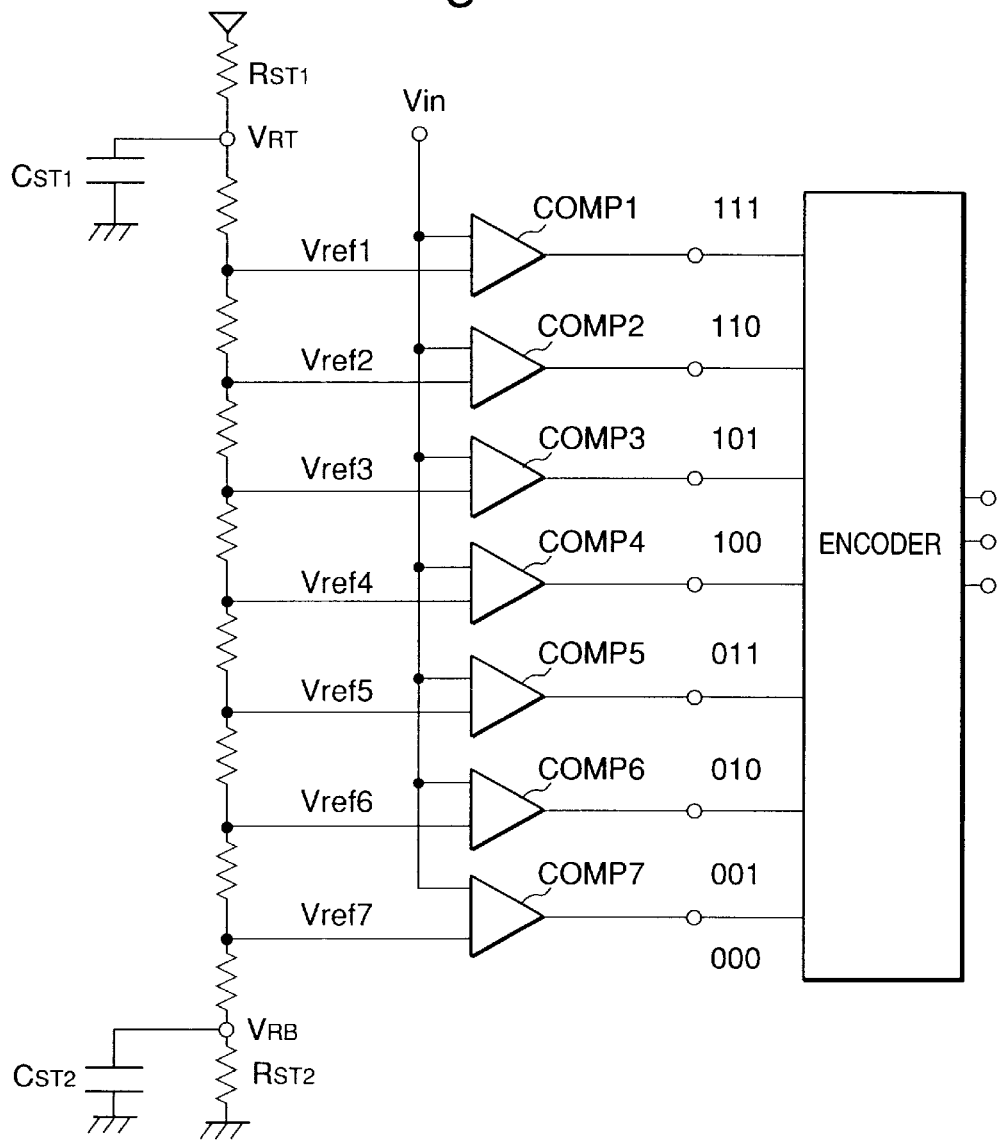
FIG. 1A shows a circuit diagram of a flash A/D converter which comprises a voltage comparator according to an embodiment is of the present invention.
FIG. 1B shows a table of the input and output of the encoder shown in FIG. 1A.

FIG. 1A illustrates a flash A/D converter which comprises seven voltage comparators COMP1 to COMP7, and each of the comparators COMP1 to COMP7 is a chopper-type voltage comparator in accordance with one embodiment of the present invention. The A/D converter is a differential input type converter and obtains a voltage comparison result between an input voltage $V_{in}$ and a reference voltage $V_{ref}$ by simultaneously processing the voltages $V_{in}$ and $V_{ref}$. In the A/D converter, the input voltage $V_{in}$ is an analog voltage, and the first through seventh reference voltages $V_{ref1}$ to $V_{ref7}$ are obtained by segmenting the difference between two voltages $V_{RT}$ and $V_{RB}$ via a resistor divider. Also, the voltage $V_{RT}$ is generated via a stabilization circuit formed by a resistor $R_{ST1}$ and a capacitor $C_{ST1}$, and the voltage $V_{RB}$ is generated via a stabilization circuit formed by a resistor $R_{ST2}$ and a capacitor $C_{ST2}$. The input voltage $V_{in}$ is input to all of the comparators COMP1 through COMP7, and the reference voltages $V_{ref1}$ to $V_{ref7}$ are respectively input to the comparators COMP1 to COMP7. The first comparator COMP1 compares the input voltage $V_{in}$ with the first reference voltage $V_{ref1}$ and outputs supply voltage $V_{pp}$ (i.e. a logic "1") or ground voltage GND (i.e. logic "0") as first voltage comparison result. Also, the comparators COMP2 to COMP7 simultaneously and respectively compare the input voltage $V_{in}$ with the reference voltages $V_{ref2}$ to $V_{ref7}$ and output second to seventh voltage comparison results. Also, although not shown in the figure, the comparators COMP1 and COMP7 also have complementary outputs which output the complement of the first to seventh voltage comparison results, respectively.

An encoder inputs the first to seventh comparison results from the voltage comparators COMP1 through COMP7 and encodes the voltage $V_{in}$ into a three bit digital signal based on the comparison results. For example, if the voltage $V_{in}$ is less than all of the reference voltages $V_{ref1}$ to $V_{ref7}$ (i.e. all of the comparators COMP1 to COMP7 output a logic "0"), the encoder encodes the comparison results as the data "000". If the voltage $V_{in}$ is less than all of the reference voltages $V_{ref1}$ to $V_{ref6}$ and is greater than the voltage $V_{ref7}$ (i.e. the comparators COMP1 to COMP6 output a logic "0" and the comparator COMP7 outputs a logic "1"), the encoder encodes the comparison results as the data "001". Also, as shown in FIGS. 1A and 1B, the encoder encodes the seven comparison results into the data "000", "001", "010", "011", "100", "101", "110", or "111". Thus, the flash A/D converter inputs the input voltage $V_{in}$ into the first through seventh voltage comparators COMP1 through COMP7 to convert the analog signal into a digital signal. Also, although a 3-bit A/D converter is shown in FIG. 1A, the present invention can be incorporated in any type of A/D converter.

Figure 2:
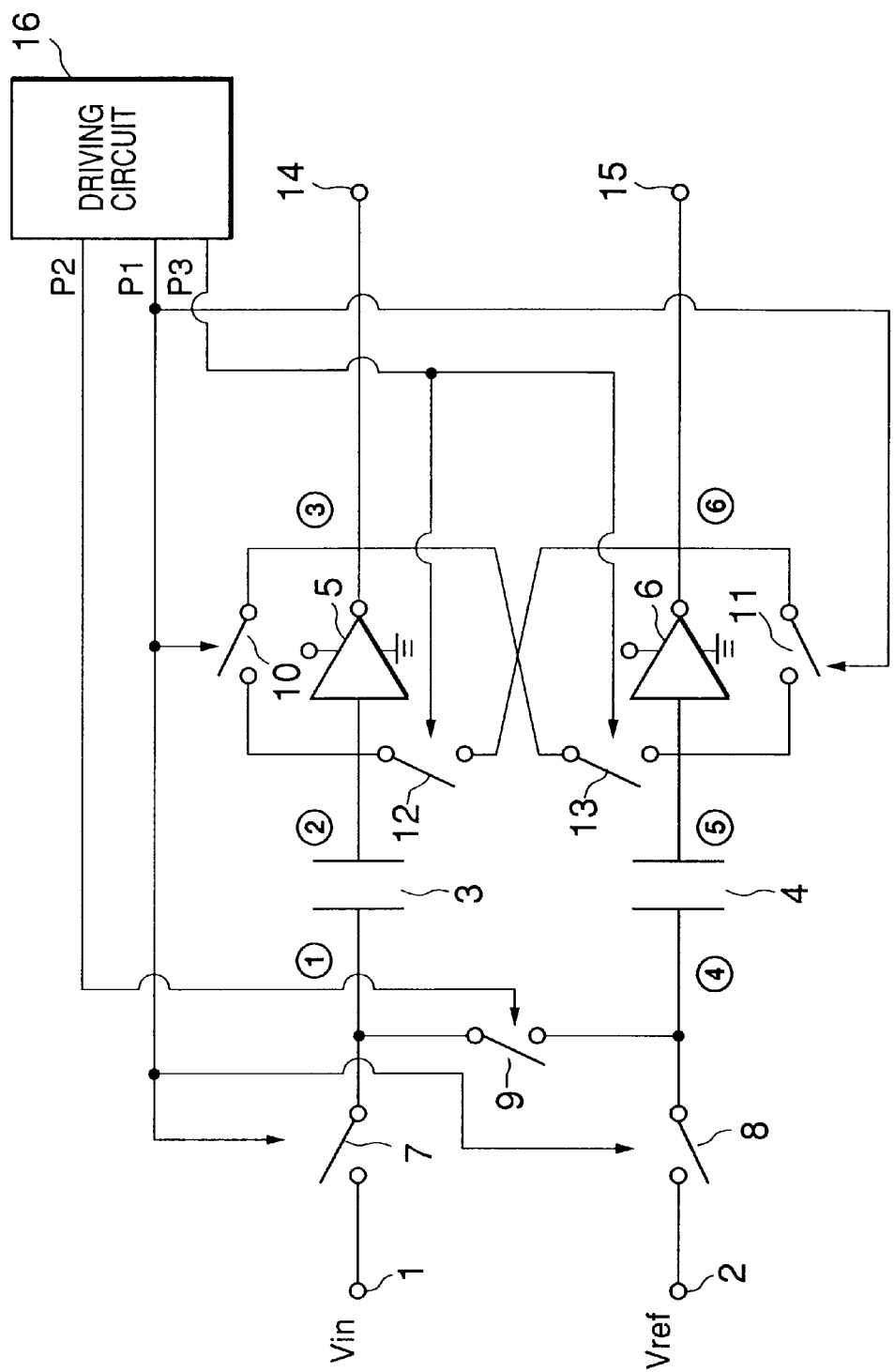
FIG. 2 shows a circuit diagram of the voltage comparator according to an embodiment of the present invention.

An example of the structure of each of the voltage comparators COMP1 to COMP7 is shown in FIG. 2. As shown in the figure, the voltage comparator comprises an input voltage terminal 1, a reference voltage terminal 2, first and second capacitors 3 and 4, first and second inverters 5 and 6, first to seventh switches 7 to 13, output terminals 14 and 15, and a driving circuit 16. Also, the first and second inverters 5 and 6 are connected to a power supply voltage and a ground voltage GND.

The reference voltage terminal 2 inputs a reference voltage $V_{ref}$, and the voltage input terminal 1 inputs an input voltage $V_{in}$ to be compared with the reference voltage $V_{ref}$. A first terminal of the first switch 7 is connected to the input terminal 1, and a second terminal of the switch 7 is connected to a first terminal of the first capacitor 3. A second terminal of the capacitor 3 is connected to an input terminal of the first inverter 5, and an output terminal of the inverter 5 is connected to the output terminal 14.

A first terminal of the second switch 8 is connected to the reference voltage terminal 2, and a second terminal of the switch 8 is connected to a first terminal of the second capacitor 4. A second terminal of the capacitor 4 is connected to an input terminal of the second inverter 6, and an output terminal of the inverter 6 is connected to the output terminal 15.

A first terminal of the third switch 9 is connected to the first terminal of the first capacitor 3, and a second terminal of the switch 9 is connected to the first terminal of the second capacitor 4. A first terminal of the fourth switch 10 is connected to the input terminal of the inverter 5, and a second terminal of the switch 10 is connected to the output terminal of the inverter 5. Also, a first terminal of the fifth switch 11 is connected to the input terminal of the inverter 6, and a second terminal of the switch 11 is connected to the output terminal of the inverter 6.

A first terminal of the sixth switch 12 is connected to the input terminal of the first inverter 5, and a second terminal of the switch 12 is connected to the output terminal of the second inverter 6. Conversely, a first terminal of the seventh switch 12 is connected to the output terminal of the first inverter 5, and a second terminal of the switch 13 is connected to the input terminal of the second inverter 6.

Also, the driving circuit 16 outputs drive signals P1, P2, and P3 to selectively open and close the switches 7 to 13. Specifically, when the first drive signal P1 equals "1", the first, second, fourth, and fifth switches 7, 8, 10, and 11 are closed (i.e. conductive), and when the signal P1 equals "0", the switches 7, 8, 10, and 11 are opened (i.e. non-conductive). When the second drive signal P2 equals "1", the third switch 9 is closed, and when the signal P2 equals "0", the switch 9 is opened. Finally, when the third drive signal P3 equals "1", the sixth and seventh switches 12 and 13 are closed, and when the signal P3 equals "0", the switches 12 and 13 are opened.

By properly controlling the switches 7 to 13 via the drive signals P1 to P3, the voltage comparator outputs a voltage comparison result based on the relationship between the input voltage $V_{in}$ and the reference voltage $V_{ref}$. Specifically, if the input voltage $V_{in}$ is larger than the reference voltage $V_{ref}$, the comparator outputs the supply voltage $V_{pp}$ (i.e. a logic "1") of the first inverter 5 from the first output terminal 14 as the voltage comparison result. If the input voltage $V_{in}$ is smaller than the reference voltage $V_{ref}$, the comparator outputs a ground voltage GND (i.e. a logic "0") from the first output terminal 14 as the voltage comparison result. Also, the signal output from the second output terminal 15 is the complement of the signal outputs from the first output terminal 14.

Figure 3:
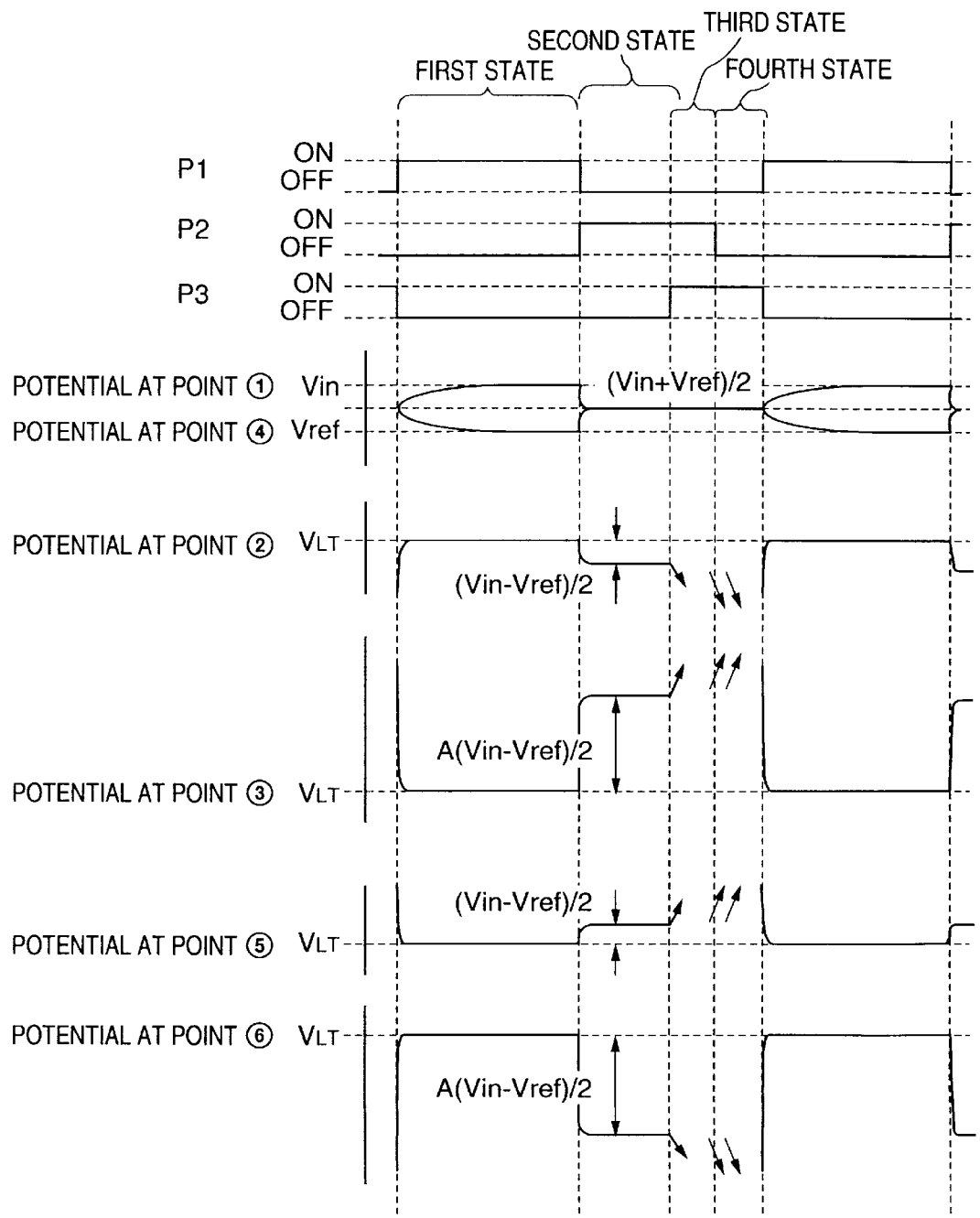
FIG. 3 shows a waveform diagram of voltages at various points of the circuit diagram shown in FIG. 2 during a theoretical operation of the voltage comparator.
Figure 4:
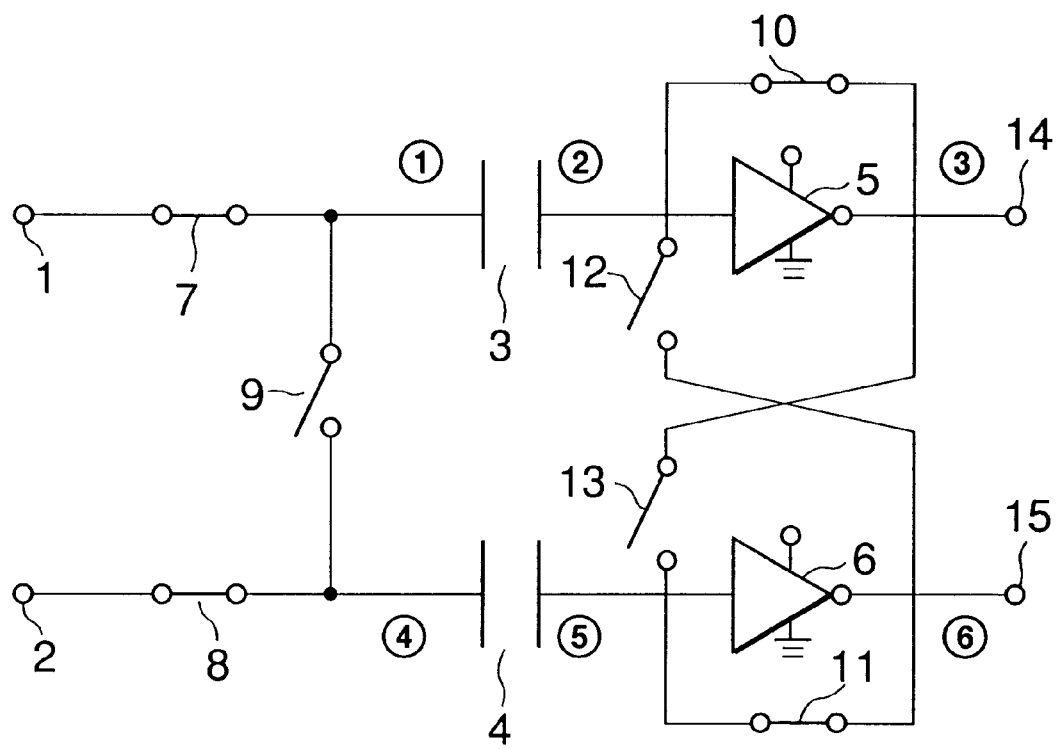
FIG. 4 shows a circuit diagram of the voltage comparator shown in FIG. 2 when the voltage comparator is in a first operational state.

The comparing operation performed by the chopper-type voltage comparator shown in FIG. 2 is performed in four stages. As shown in FIG. 3, the first stage is defined when the first drive signal P1 equals "1", the second drive signal P2 equals "0", and the third drive signal P3 equals "0". The second stage is defined when the first drive signal P1 equals "0", the second drive signal P2 equals "1", and the third drive signal P3 equals "0". The third stage is defined when the first drive signal P1 equals "0", the second drive signal P2 equals "1", and the third drive signal P3 equals "1". Finally, the fourth stage is defined when the first drive signal P1 equals "0", the second drive signal P2 equals "0", and the third drive signal P3 equals "1".

Each of the operational stages of the voltage comparator will be described below in conjunction with FIGS. 4 to 7. During the first stage (i.e. P1="1", P2="0", and P3="0"), the drive signals P1 to P3 control the switches such that they are in the positions illustrated in FIG. 4. Specifically, when the first drive signal P1 equals "1", the first, second, fourth, and fifth switches 7, 8, 10, and 11 are closed. When the second drive signal P2 equals "0", the third switch 9 is opened. When the third drive signal P3 equals "0", the sixth and seventh switch 12 and 13 are opened.

Thus, in the first stage, the voltage at the first terminal of the first capacitor 3 (i.e. at point 1) becomes the level of the input voltage $V_{in}$. Simultaneously, the voltage at the first terminal of the second capacitor 4 (i.e. at point 4) becomes the level of the reference voltage $V_{ref}$.

Also, since the fourth switch 10 is closed, the input terminal and the output terminal of the first inverter 5 are short-circuited, and thus, the voltage at the input terminal (i.e. at point 2) and at the output terminal (i.e. at point 3) equal the threshold voltage $V_{LT}$ of the inverter 5. Similarly, since the fifth switch 11 is closed, the input terminal and the output terminal of the second inverter 6 are short-circuited, and thus, the voltage at the input terminal (i.e. at point 5) and at the output terminal (i.e. at point 6) equal the threshold voltage $V_{LT}$ of the inverter 6. The duration of the first stage is long enough to enable the capacitors 3 and 4 to adequately sample the voltages $V_{in}$ and $V_{ref}$ respectively.

Figure 5:
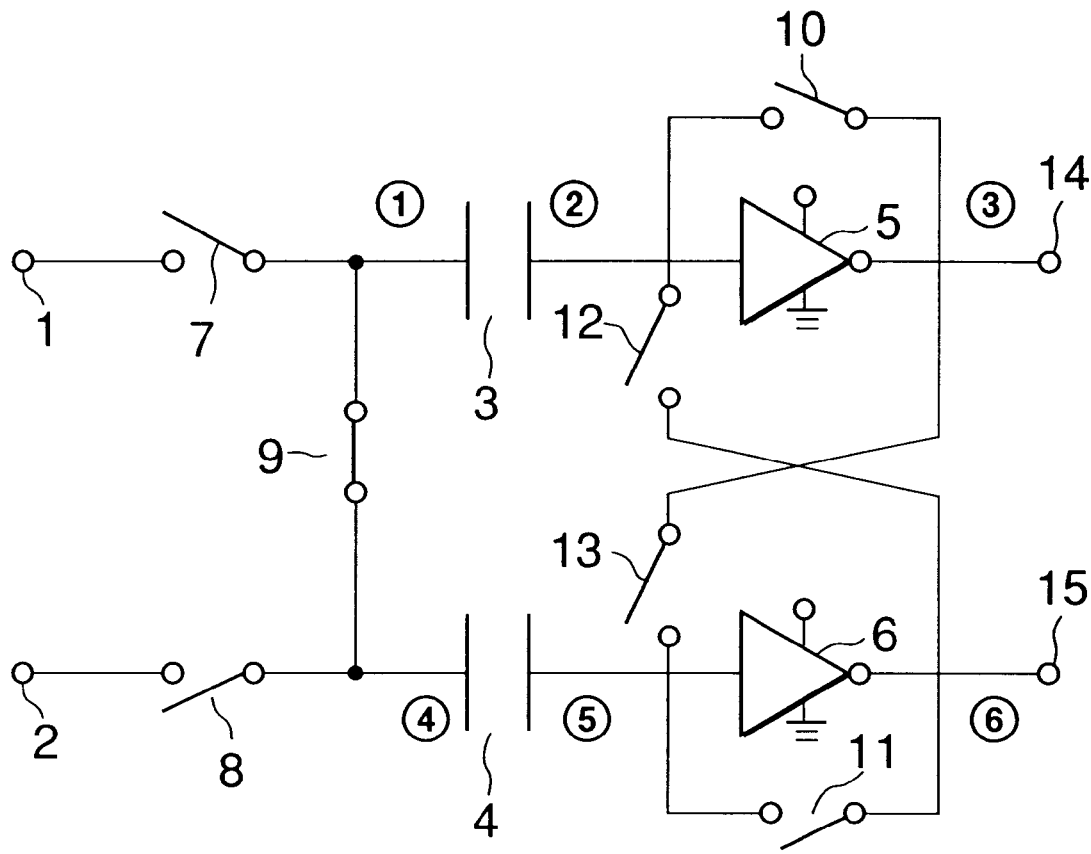
FIG. 5 shows a circuit diagram of the voltage comparator shown in FIG. 2 when the voltage comparator is in a second operational state.

Then, in the second stage (i.e. P1="0", P2="1", P3="0"), the drive signals P1 to P3 control the switches such that they are in the positions illustrated in FIG. 5. Specifically, when the first drive signal P1 equals "0", the first, second, fourth, and fifth switches 7, 8, 10, and 11 are opened. When the second drive signal P2 equals "1", the third switch 9 is closed. When the third drive signal P3 equals "0", the sixth and seventh switch 12 and 13 are opened.

Since the third switch 9 is closed, the first terminal of the first capacitor 3 is short-circuited with the first terminal of the second capacitor 4. Therefore, the electric charge at both of the first terminals (i.e. at points 1 and 4) becomes the average of the electric charge on the first terminal of the first capacitor 3 and the electric charge on the first terminal of the second capacitor 4. In other words, the voltage on the first terminal of the first capacitors 3 and 4 become the voltage $(V_{in}+V_{ref})/2$. In the present illustrative example, the voltage $V_{in}$ is greater than the voltage $V_{ref}$. Thus, when the switch 9 is closed, charge flows from the first terminal of the first capacitor 3 to the first terminal of the second capacitor 4 to establish the average voltage $(V_{in}+V_{ref})/2$ on the first terminal of both capacitors 3 and 4.

As the transfer of charge occurs between the first terminals of the first and second capacitors 3 and 4, the original voltage $V_{in}$ of the first terminal of the first capacitor 3 is reduced by one half of the difference between the voltage at the first terminal of the capacitor 3 and the voltage at first terminal of the second capacitor 4. In other words, the original voltage $V_{in}$ at the first terminal of the capacitor 3 is reduced by the voltage $(V_{in}-V_{ref})/2$ to be equalized to the voltage $(V_{in}+V_{ref})/2$. Conversely, the original voltage $V_{ref}$ at the first terminal of the second capacitor 4 is increased by the voltage $(V_{in}-V_{ref})/2$ to be equalized to the voltage $(V_{in}+V_{ref})/2$.

In order to compensate for the reduction of the original voltage $V_{in}$ at the first terminal of the first capacitor 3 by the voltage $(V_{in}-V_{ref})/2$, the original voltage $V_{LT}$ at the second terminal of the capacitor 3 (i.e. at point 2) is likewise reduced by $(V_{in}-V_{ref})/2$ and becomes $V_{LT}-(V_{in}-V_{ref})/2$. Then, the inverter 5 inputs the voltage $V_{LT}-(V_{in}-V_{ref})/2$, subtracts its threshold voltage $V_{LT}$ from the voltage $V_{LT}-(V_{in}-V_{ref})/2$ to obtain the voltage $-(V_{in}-V_{ref})/2$, and amplifies the voltage $-(V_{in}-V_{ref})/2$ by an amplification factor $-A$ to obtain the voltage $A(V_{in}-V_{ref})/2$. Then, before the voltage $A(V_{in}-V_{ref})/2$ is output from the inverter 5, it is added to the threshold voltage $V_{LT}$ of the inverter 5 to obtain the voltage $V_{LT}+A(V_{in}-V_{ref})/2$. As a result, the voltage $V_{LT}+A(V_{in}-V_{ref})/2$ is present at the output terminal of the inverter 5 (i.e. at point 3).

Similarly, in response to the increase of the original voltage $V_{ref}$ at the first terminal of the second capacitor 4 by the voltage $(V_{in}-V_{ref})/2$, the original voltage $V_{LT}$ at the second terminal of the capacitor 4 (i.e. at point 5) is likewise increased by $(V_{in}-V_{ref})/2$ and becomes $V_{LT}+(V_{in}-V_{ref})/2$. Then, the inverter 6 inputs the voltage $V_{LT}+(V_{in}-V_{ref})/2$, subtracts its threshold voltage $V_{LT}$ from the voltage $V_{LT}+(V_{in}-V_{ref})/2$ to obtain the voltage $(V_{in-Vref})/2$, and amplifies the voltage $(V_{in}-V_{ref})/2$ by an amplification factor $-A$ to obtain the voltage $-A(V_{in}-V_{ref})/2$. Then, before the voltage $-A(V_{in}-V_{ref})/2$ is output from the inverter 6, it is added to the threshold voltage $V_{LT}$ of the inverter 6 to obtain the voltage $V_{LT}-A(V_{in}-V_{ref})/2$. As a result, the voltage $V_{LT}-A(V_{in}-V_{ref})/2$ is present at the output terminal of the inverter 5 (i.e. at point 6).

The duration of the second stage is long enough to enable sufficient amplification to the voltages the $V_{LT}+A(V_{in}-V_{ref})/2$ and $V_{LT}-A(V_{in}-V_{ref})/2$ by the inverters 5 and 6, respectively.

Figure 6:
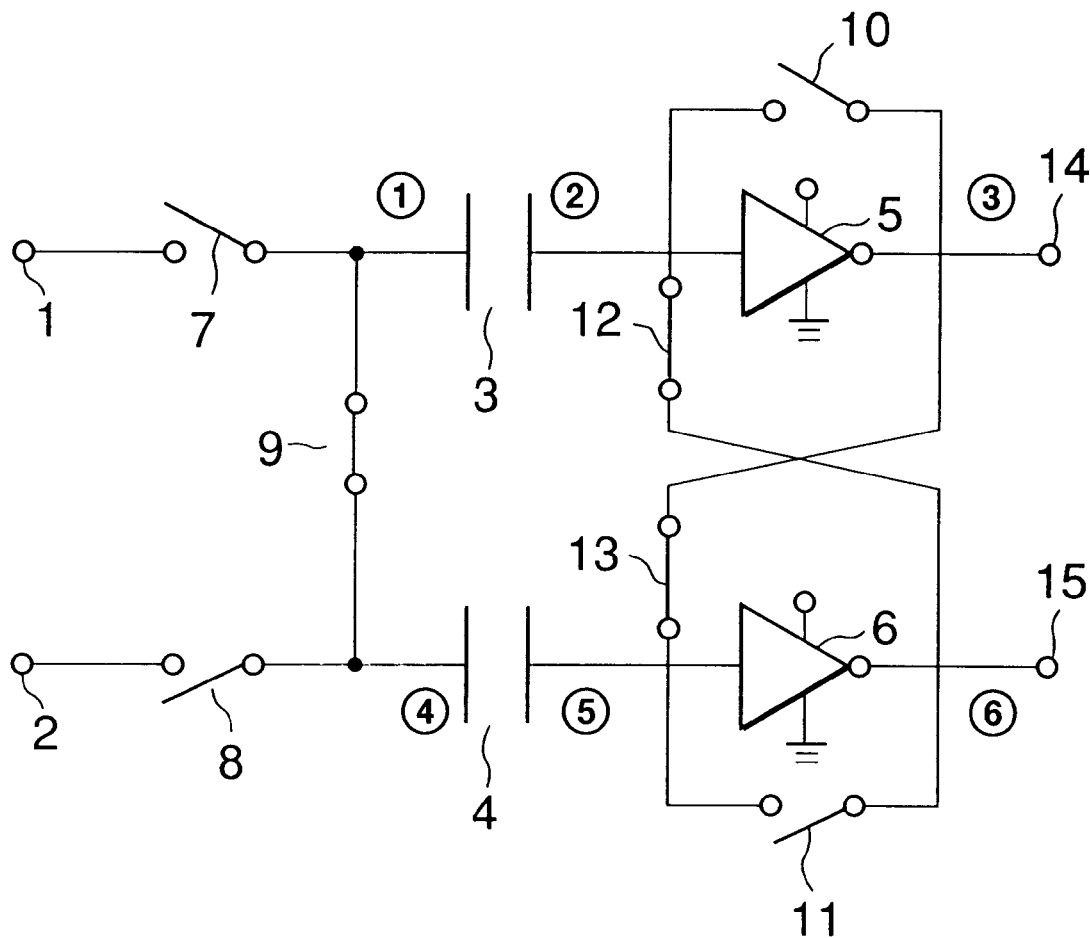
FIG. 6 shows a circuit diagram of the voltage comparator shown in FIG. 2 when the voltage comparator is in a third operational state.

Then, in the third stage (i.e. P1="0", P2="1", P3="1"), the drive signals P1 to P3 control the switches such that they are in the positions illustrated in FIG. 6. Specifically, when the first drive signal P1 equals "0", the first, second, fourth, and fifth switches 7, 8, 10, and 11 are opened. When the second drive signal P2 equals "1", the third switch 9 is closed. When the third drive signal P3 equals "1", the sixth and seventh switch 12 and 13 are closed.

In the third stage, the first and second switches 7 and 8 remain open, and the third switch 9 remains closed. Therefore, the voltages at the first terminals of the capacitors 3 and 4 (i.e. at points 1 and 4) remain the same. However, since the fourth and fifth switches 10 and 11 remain open and since the sixth and seventh switches 12 and 13 become closed, the output terminal of the first inverter 5 is connected to the input terminal of the second inverter 6, and the output terminal of the second inverter 6 is connected to the input terminal of the first inverter 5. Therefore, the inverters 5 and 6 form a latch circuit.

As a result, when the voltage $V_{LT}+A(V_{in}-V_{ref})/2$ output by the first inverter 5 is input by the second inverter 6, the inverter 6 subtracts its logical threshold voltage $V_{LT}$ from the voltage $V_{LT}+A(V_{in}-V_{ref})/2$ to produce a voltage $A(V_{in}-V_{ref})/2$, and the voltage $A(V_{in}-V_{ref})/2$ is amplified by $-A$ to produce the voltage $-A^2(V_{in}-V_{ref})/2$. Then, the threshold voltage $V_{LT}$ is added to the voltage $-A^2(V_{in}-V_{ref})/2$, and the second inverter 6 outputs the voltage $V_{LT}-A^2(V_{in}-V_{ref})/2$. Afterwards, the output voltage $V_{LT}-A^2(V_{in}-V_{ref})/2$ is fed back to the input terminal of the first inverter 5, and the inverter 5 subtracts its logical threshold voltage $V_{LT}$ from the voltage $V_{LT}-A^2(V_{in}-V_{ref})/2$ to produce a voltage $-A^2(V_{in}-V_{ref})/2$. Then, the voltage $-A^2(V_{in}-V_{ref})/2$ is amplified by the amplification factor $-A$ to produce the voltage $A^3(V_{in}-V_{ref})/2$, the threshold voltage $V_{LT}$ is added to the voltage $A^3(V_{in}-V_{ref})/2$, and the first inverter 5 outputs the voltage $V_{LT}+A^3(V_{in}-V_{ref})/2$.

As shown above, the initial voltage output from the first inverter 5 at the beginning of the third stage (i.e. at point 3) is $V_{LT}+A(V_{in}-V_{ref})/2$, and the next voltage output by the inverter 5 after the initial voltage $V_{LT}+A(V_{in}-V_{ref})/2$ is processed by the second inverter 6 and fed back to the first inverter 5 is $V_{LT}+A^3(V_{in}-V_{ref})/2$. Therefore, the output of the first inverter 5 increases by a factor of $A^2$ during each feed back operation. Also, the output of the second inverter 6 similarly increases by a factor of $A^2$ during each feedback operation.

Accordingly, the voltage at the input terminal of the first inverter 5 (i.e. at point 2) becomes $V_{LT}-\{A^{n-1}(V_{in}-V_{ref})/2\}$, and the voltage at the output terminal of the inverter 5 (i.e. at point 3) becomes $V_{LT}+\{A^n(V_{in}-V_{ref})/2\}$. Similarly, the voltage at the input terminal of the second inverter 6 (i.e. at point 5) becomes $V_{LT}+(A^{n-1}(V_{in}-V_{ref})/2\}$, and the voltage at the output terminal of the inverter 6 (i.e. at point 6) becomes $V_{LT}\{A(V_{in}-V_{ref})/2\}$. In other words, the voltages at points 2, 3, 5, and 6 approach either the supply voltage Vpp or the ground voltage GND as time progresses. Also, in the equations above, the variable "n" denotes an integer greater than or equal to two which increases by two each time a feedback operation is performed. Also, in the present embodiment, the first and second inverters 5 and 6 are assumed to have equal inverting characteristics. In other words, each of the inverters 5 and 6 have an amplification factor $-A$.

As indicated above, whether or not the voltages discussed above approach the supply voltage Vpp or the ground voltage GND is determined by the relationship between the input voltage $V_{in}$ and the reference voltage $V_{ref}$. In particular, if the input voltage $V_{in}$ is higher than the reference voltage $V_{ref}$, the voltages at points 2 and 6 approach the ground potential GND, and the voltages at points 3 and 5 approach the supply voltage $V_{pp}$. On the other hand, if the input voltage $V_{in}$ is lower than the reference voltage $V_{ref}$, the voltages at points 2 and 6 approach the supply voltage $V_{pp}$, and the voltages at points 3 and 5 approach the ground voltage GND. Also, the supply voltage $V_{pp}$ represents the supply voltage supplied to the first and second inverters 5 and 6.

The voltage comparison result (i.e. the voltage output from the output terminal 14 or 15) indicating the relationship between the input voltage $V_{in}$ and the reference voltage $V_{ref}$ can be obtained by remaining in the third stage (i.e. P1="0", P2="1", and P3="1") for longer than a certain period of time. However, in the third stage, the switch 9 is closed, and thus, the first and second capacitors 3 and 4 are connected as load capacitors for the first and second inverters 5 and 6, respectively. Therefore, a relatively long period of time is required to obtain the voltage comparison result.

Figure 7:
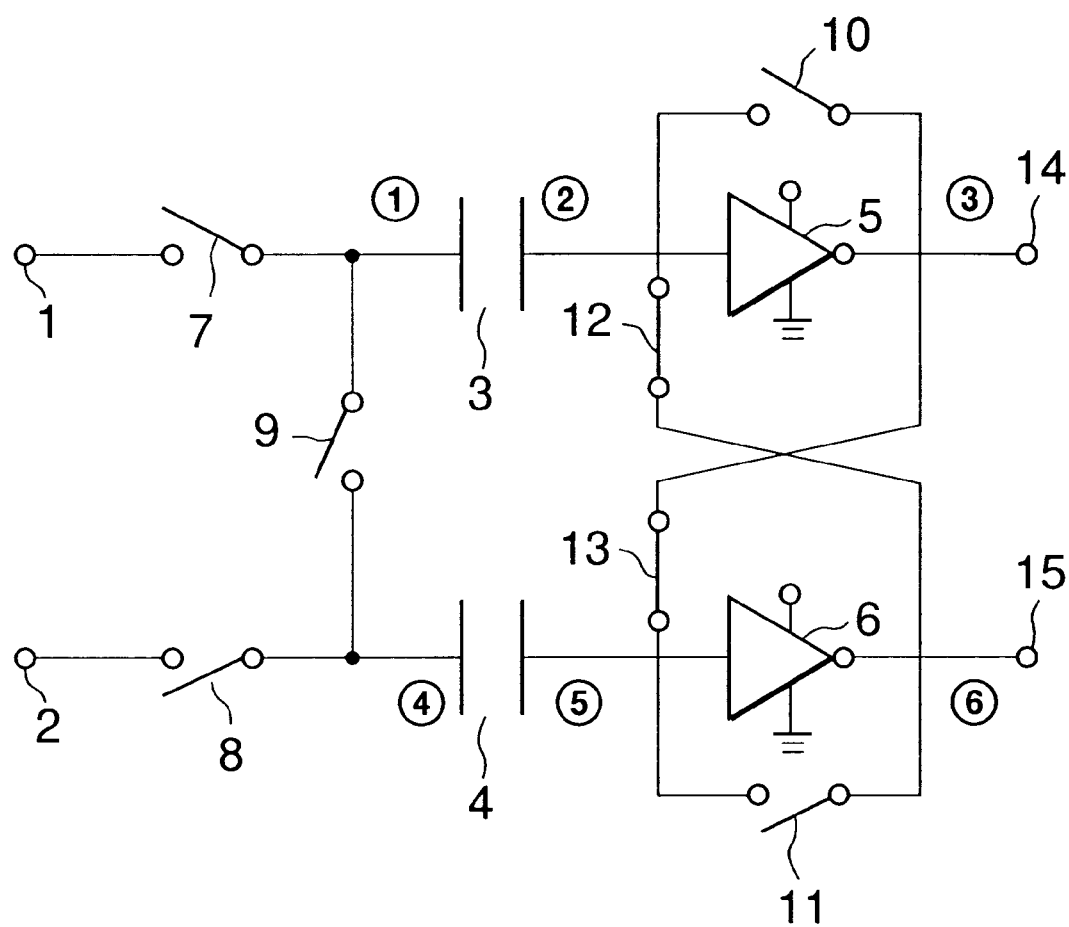
FIG. 7 shows a circuit diagram of the voltage comparator shown in FIG. 2 when the voltage comparator is in a fourth operational state.

Therefore, in order to speed up the voltage comparison, the drive signal P2 is switched to a "0" to open the switch 9 during the fourth stage (i.e. P1="0", P2="0", and P3="1") as shown in FIG. 7. By opening the switch 9, the capacitors 5 and 6 do not act as load capacitors for the latch circuit formed by the inverters 5 and 6, and the speed of the feedback operation performed by the latch circuit is increased. As a result, the voltages output from the latch circuit to the output terminals 14 and 15 reach the supply voltage $V_{pp}$ and the ground voltage GND much more quickly. Such increase in speed is designated by the double arrows in the fourth stage shown in FIG. 3.

As described above, the voltage comparator of the present embodiment requires only two inverters to obtain the desired logic level of the voltage comparison result. In contrast, the conventional voltage comparator requires many multistage inverters connected in series to increase precision and/or to obtain a voltage comparison result having a desired logic level. Therefore, the voltage comparator of the present invention consumes much less power than the conventional device.

Also, in contrast with the conventional voltage comparator, the voltage comparator of the present invention is not affected by common-mode noise such as a power supply noise. The resistance to common-mode noise has recently become very important. One reason is that a chopper-type voltage comparator is used as part of an A/D converter, and lately A/D converters are being formed and packaged on the same chips on which the digital systems using the A/D converters are mounted. In such a situation, the digital system and corresponding A/D converter share the same power supply and ground, and thus, a noise created in the digital system is likely to be transmitted to the A/D converter via the power supply or ground.

Specifically, the digital system is generally based on CMOS technology and performs digital switching operations (i.e. switching from a "0" to "1" or from a "1" to "0") asynchronously with the A/D converter. In such a digital system, current flows from the power supply to ground during the switching operation. Since many logic gates in the digital system operate nearly at the same time, the voltage of the power supply and ground oscillate intensely during a switching operation, and such voltage oscillation is transmitted to the A/D converter as common-mode noise. In many cases in which common-mode noises occur, the noises are terminated when the switching operation of the digital system terminates. Also, external noises originating from outside of the chip which affect the voltage of the power supply are terminated when the switching operation terminates.

The reason why the voltage comparator of the present invention is not affected by common-mode noise will be described below in conjunction with FIG. 8 which illustrates a situation in which the threshold voltages $V_{LT}$ of the inverters 5 and 6 are affected by a common-mode noise. As shown in the figure, when a common-mode noise occurs between the first and second stages, the threshold voltages $V_{LT}$ of the first and second inverters 5 and 6 fluctuate by a voltage $V_{NOISE}$. Specifically, the voltage $V_{NOISE}$ increases the voltage at the input of the inverter 5 (i.e. at point 2) such that it equals $V_{LT}+(V_{NOISE}-(V_{in}-V_{ref})/2)$ instead of $V_{LT}-(V_{in}-V_{ref})/2$. Since the voltage $V_{LT}+(V_{NOISE}-(V_{in}-V_{ref})/2)$ is amplified by the factor $-A$ in the first inverter 5, the voltage output at the output terminal of the inverter 5 (i.e. at point 3) equals $V_{LT}-A(V_{NOISE}-(V_{in}-V_{ref})/2)$. Similarly, the voltage of the noise $V_{NOISE}$ increases the voltage at the input of the inverter 6 (i.e. at point 5) such that it equals $V_{LT}+(V_{NOISE}+(V_{in}-V_{ref})/2)$ instead of $V_{LT}+(V_{in}-V_{ref})/2$. Since the voltage $V_{LT}+(V_{NOISE}+(V_{in}-V_{ref})/2)$ is amplified by the factor −A in the second inverter 6, the voltage output at the output terminal of the inverter 6 (i.e. at point 6) equals $V_{LT}-A(V_{NOISE}+(V_{in}-V_{ref})/2)$.

Figure 8:
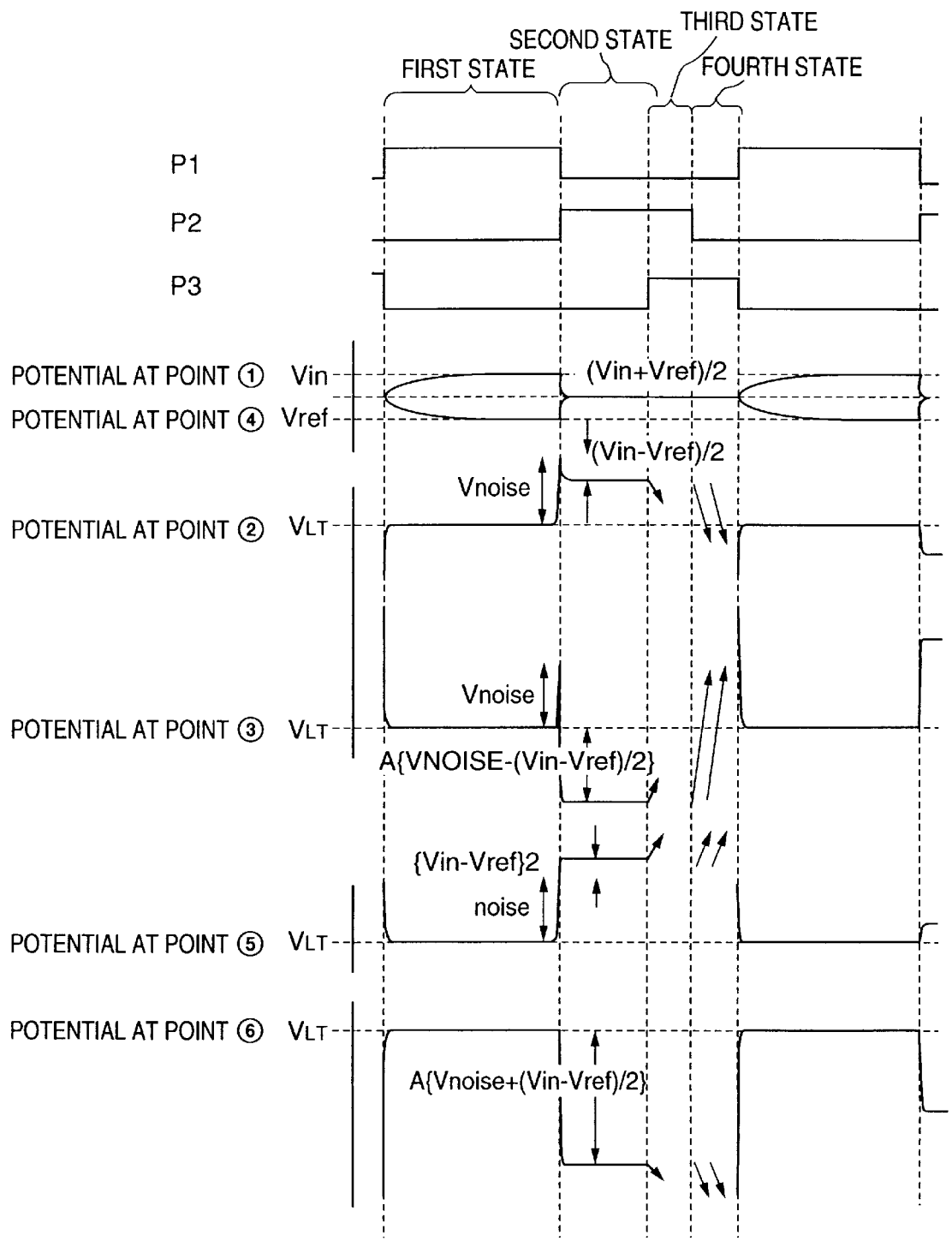
FIG. 8 shows a waveform diagram of voltages at various points of the circuit diagram shown in FIG. 2 during an actual operation of the voltage comparator in which common-mode noise is generated.
Figure 9:
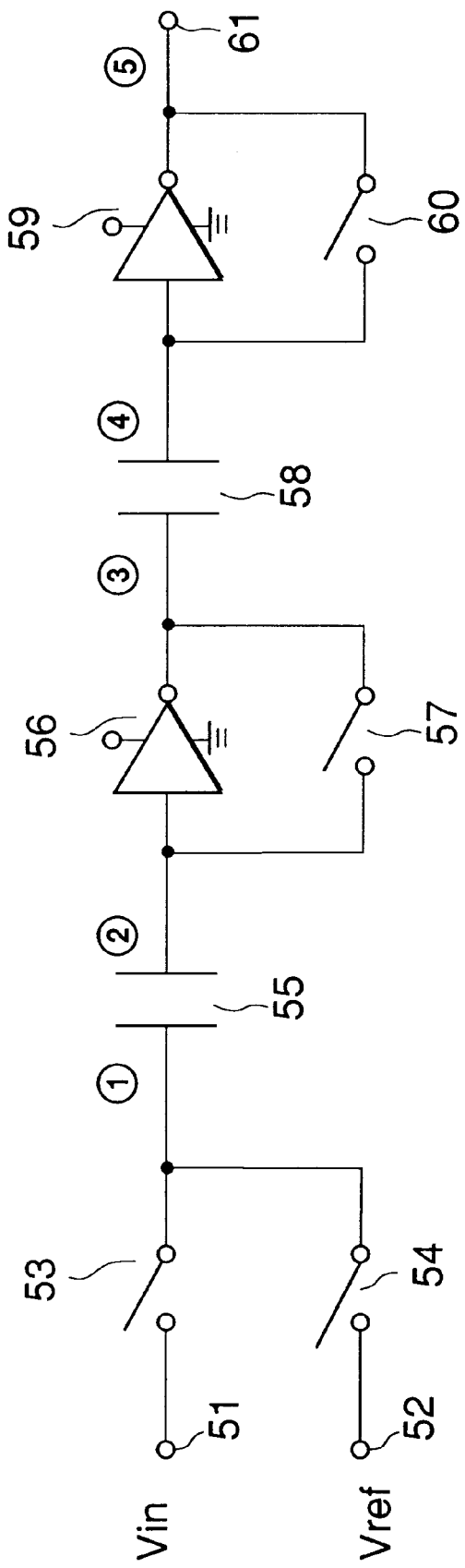
FIG. 9 shows a circuit diagram of a conventional voltage comparator.

As shown in FIG. 8, if the voltage $V_{NOISE}$ is greater than the voltage $(V_{in}-V_{ref})/2$ and the voltage $V_{in}$ is greater than the voltage $V_{ref}$, the voltage at points 3 and 6 will each be less than the threshold voltages $V_{LT}$ of the inverters 5 and 6. Also, upon comparing the voltages at points 3 and 6, the voltage at point 6 is lower than the voltage at point 3 with respect to the threshold voltage $V_{LT}$. In other words, the potential difference between the voltage at point 6 and the threshold voltage $V_{LT}$ is larger than the potential difference between the voltage at point 3 and the threshold voltage $V_{LT}$.

When the third stage is entered under such a situation, the voltage at point 3 is fed back to point 2, and the potential at point 6 is fed back to point 5. Then, the difference between the voltage at point 5 and the threshold voltage $V_{LT}$ is amplified with the amplification factor −A and is supplied to point 6. Similarly, the difference between the voltage at point 2 and the threshold voltage $V_{LT}$ is amplified with the amplification factor −A and supplied is supplied to point 3. Since the potentials at points 3 and 6 are both lower than the threshold voltage $V_{LT}$ in the second stage, the potentials at points 3 and 6 at the beginning of the third stage both tend to become greater than the threshold voltage $V_{LT}$ due to the inverted amplification. However, since the potential at point 6 is lower than the potential at point 3 with respect to the logical threshold voltage $V_{LT}$ in the second stage, the potential at point 3 is intensely drawn over the potential at point 6 at the beginning of the third stage. Also, in the feed back cycle in which the voltage at point 3 is supplied to point 5, the voltage supplied to point 5 is inverted, amplified, and output to point 6. Also, the voltage output to point 6 is supplied to point 2, and the voltage supplied to point 2 is inverted, amplified, and output to point 3. When such cycle is repeated, the voltage at point 3 converges to "1", and the voltage at point 6 converges to "0". Furthermore, upon shifting from the third stage to the fourth stage, the above convergences to "1" and "0" are accelerated.

As a result, the values of the voltages output from the output terminals 14 and 15 when the voltage comparator experiences common-mode noise are the same as the values of the voltage output from the terminals 14 and 15 in the theoretical case described above. Thus, the voltage comparator of the present embodiment correctly output the voltage comparison result when common-mode noise occurs.

Another embodiment of the voltage comparator is shown in FIGS. 12A to 12D. As shown in the figures, the voltage comparator comprises an input voltage terminal 1, a reference voltage terminal 2, first and second capacitors 3 and 4, first and second inverters 5 and 6, first to seventh switches 7 to 11, 16, and 17, and output terminals 14 and 15. Also, the first and second inverters 5 and 6 are connected to a power supply voltage and a ground voltage GND.

In the embodiment, a driving circuit (not shown) outputs drive signals P1, P2, and P3 to selectively open and close the switches 7 to 11, 16, and 17. Specifically, when the first drive signal P1 equals "1", the first, second, fourth, and fifth switches 7, 8, 10, and 11 are closed, and when the signal P1 equals "0", the switches 7, 8, 10, and 11 are opened. When the second drive signal P2 equals "1", the third switch 9 is closed, and when the signal P2 equals "0", the switch 9 is opened. Finally, when the third drive signal P3 equals "1", the sixth and seventh switches 16 and 17 are closed, and when the signal P3 equals "0", the switches 16 and 17 are opened.

By properly controlling the switches 7 to 11, 16, and 17 via the drive signals P1 to P3, the voltage comparator outputs a voltage comparison result based on the relationship between the input voltage $V_{in}$ and the reference voltage $V_{ref}$ in the manner similar to the manner described above.

Specifically, the comparing operation performed by the chopper-type voltage comparator shown is performed in four stages. During the first stage, the drive signals P1 to P3 control the switches such that they are in the positions illustrated in FIG. 12A. As a result, the voltage at the first terminal of the first capacitor 3 (i.e. at point 1) becomes the level of the input voltage $V_{in}$. Simultaneously, the voltage at the first terminal of the second capacitor 4 (i.e. at point 4) becomes the level of the reference voltage $V_{ref}$.

Also, since the fourth switch 10 is closed, the input terminal and the output terminal of the first inverter 5 are short-circuited, and thus, the voltage at the input terminal (i.e. at point 2) and at the output terminal (i.e. at point 3) equal the threshold voltage $V_{LT}$ of the inverter 5. Similarly, since the fifth switch 11 is closed, the input terminal and the output terminal of the second inverter 6 are short-circuited, and thus, the voltage at the input terminal (i.e. at point 5) and at the output terminal (i.e. at point 6) equal the threshold voltage $V_{LT}$ of the inverter 6. Thus, the voltages at the second terminals of the capacitors 3 and 4 (i.e. at points 2 and 5) equal the threshold voltages $V_{LT}$ of the inverters 5 and 6, respectively. Also, the duration of the first stage is long enough to enable the capacitors 3 and 4 to adequately sample the voltages $V_{in}$ and $V_{ref}$ respectively.

Figure 12A:
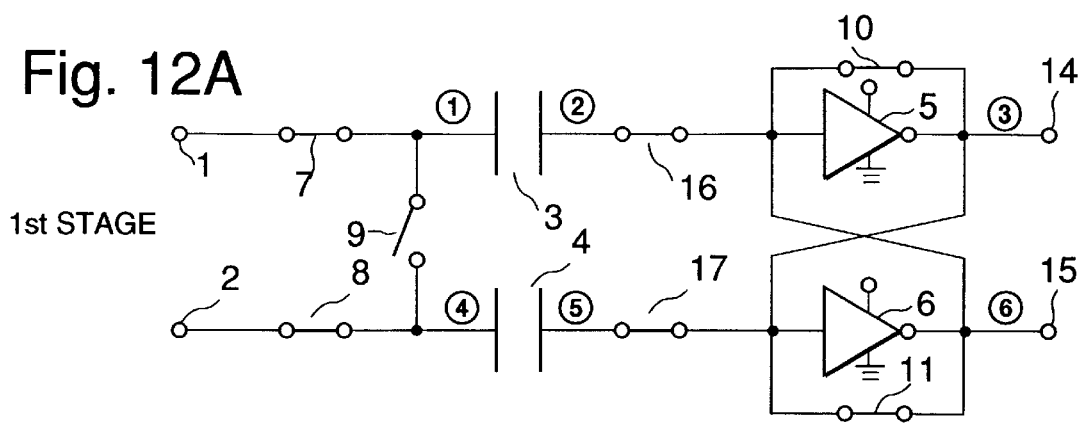
FIG. 12A shows a circuit diagram of a voltage comparator according to another embodiment when the voltage comparator is in a first operational state.
Figure 12B:
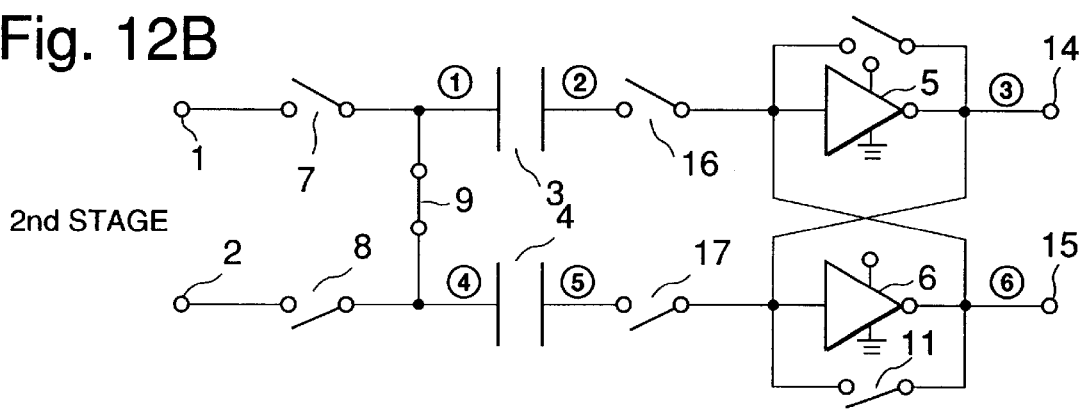
FIG. 12B shows a circuit diagram of a voltage comparator according to another embodiment when the voltage comparator is in a second operational state.
Figure 12C:
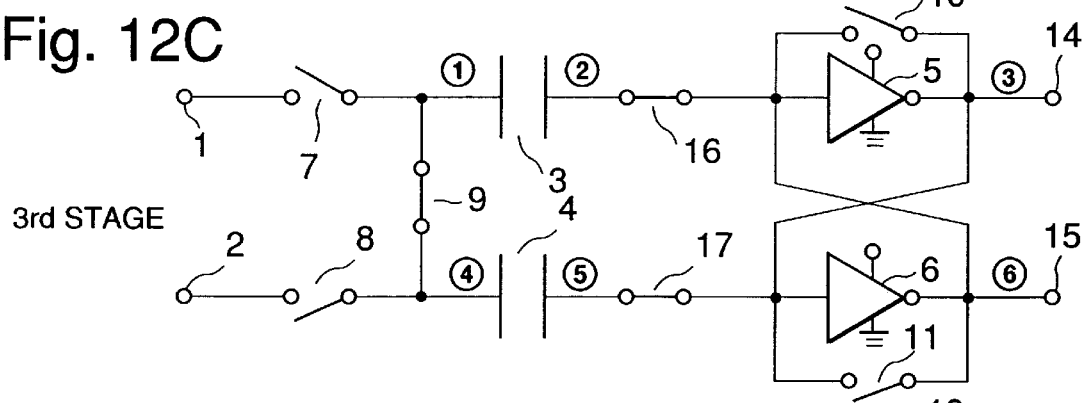
FIG. 12C shows a circuit diagram of a voltage comparator according to another embodiment when the voltage comparator is in a third operational state.

Then, in the second stage (FIG. 12B), the drive signals P1 to P3 control the switches such that they are in the positions illustrated in FIG. 12B. Since the third switch 9 is closed, the first terminal of the first capacitor 3 is short-circuited with the first terminal of the second capacitor 4. Therefore, the voltage on the first terminal of the first and second capacitors 3 and 4 becomes the voltage $(V_{in}+V_{ref})/2$. In the present illustrative example, the voltage $V_{in}$ is greater than the voltage $V_{ref}$. Thus, when the switch 9 is closed, charge flows from the first terminal of the first capacitor 3 to the first terminal of the second capacitor 4 to establish the average voltage $(V_{in}+V_{ref})/2$ on the first terminal of both capacitors 3 and 4.

As the transfer of charge occurs between the first terminals of the first and second capacitors 3 and 4, the original voltage $V_{in}$ of the first terminal of the first capacitor 3 is reduced by one half of the difference between the voltage at the first terminal of the capacitor 3 and the voltage at first terminal of the second capacitor 4. In other words, the original voltage $V_{in}$ at the first terminal of the capacitor 3 is reduced by the voltage $(V_{in}-V_{ref})/2$ to be equalized to the voltage $(V_{in}+V_{ref})/2$. Conversely, the original voltage $V_{ref}$ at the first terminal of the second capacitor 4 is increased by the voltage $(V_{in}-V_{ref})/2$ to be equalized to the voltage $(V_{in}+V_{ref})/2$.

In order to compensate for the reduction of the original voltage $V_{in}$ at the first terminal of the first capacitor 3 by the voltage $(V_{in}-V_{ref})/2$, the original voltage $V_{LT}$ at the second terminal of the capacitor 3 (i.e. at point 2) is likewise reduced by $(V_{in}-V_{ref})/2$ and becomes $V_{LT}-(V_{in}-V_{ref})/2$. Similarly, in response to the increase of the original voltage $V_{ref}$ at the first terminal of the second capacitor 4 by the voltage $(V_{in}-V_{ref})/2$, the original voltage $V_{LT}$ at the second terminal of the capacitor 4 (i.e. at point 5) is likewise increased by $(V_{in}-V_{ref})/2$ and becomes $V_{LT}+(V_{in}-V_{ref})/2$.

Then, in the third stage (FIG. 12C), the switches 16 and 17 are closed. As a result, the voltage $V_{LT}-(V_{in}-V_{ref})/2$ at the second terminal of the capacitor 3 is input to the inverter 5, and the voltage $V_{LT}+(V_{in}-V_{ref})/2$ at the second terminal of the capacitor 4 is input to the inverter 6.

After inputting the voltage $V_{LT}-(V_{in}-V_{ref})/2$, the inverter 5 subtracts its threshold voltage $V_{LT}$ from the voltage $V_{LT}-(V_{in}-V_{ref})/2$ to obtain the voltage $-(V_{in}-V_{ref})/2$ and amplifies the voltage $-(V_{in}-V_{ref})/2$ by an amplification factor $-A$ to obtain the voltage $A(V_{in}-V_{ref})/2$. Then, before the voltage $A(V_{in}-V_{ref})/2$ is output from the inverter 5, it is added to the threshold voltage $V_{LT}$ of the inverter 5 to obtain the voltage $V_{LT}+A(V_{in}-V_{ref})/2$. As a result, the voltage $V_{LT}+A(V_{in}-V_{ref})/2$ is present at the output terminal of the inverter 5 (i.e. at point 3).

Similarly, after inputting the voltage $V_{LT}+(V_{in}-V_{ref})/2$, the inverter 6 subtracts its threshold voltage $V_{LT}$ from the voltage $V_{LT}+(V_{in}-V_{ref})/2$ to obtain the voltage $(V_{in}-V_{ref})/2$, and amplifies the voltage $(V_{in}-V_{ref})/2$ by an amplification factor $-A$ to obtain the voltage $-A(V_{in}-V_{ref})/2$. Then, before the voltage $-A(V_{in}-V_{ref})/2$ is output from the inverter 6, it is added to the threshold voltage $V_{LT}$ of the inverter 6 to obtain the voltage $V_{LT}-A(V_{in}-V_{ref})/2$. As a result, the voltage $V_{LT}-A(V_{in}-V_{ref})/2$ is present at the output terminal of the inverter 6 (i.e. at point 6).

Since the output terminal of the first inverter 5 is connected to the input terminal of the second inverter 6 and the output terminal of the second inverter 6 is connected to the input terminal of the first inverter 5, the inverters 5 and 6 form a latch circuit. As a result, due to the feedback operation described above, the output of the first inverter 5 sequentially increases by a factor of $A^2$, and the output of the second inverter 6 sequentially increases by a factor of $A^2$.

Accordingly, the voltage at the input terminal of the first inverter 5 (i.e. at point 2) becomes $V_{LT}-\{A^{n-1}(V_{in}-V_{ref})/2\}$, and the voltage at the output terminal of the inverter 5 (i.e. at point 3) becomes $V_{LT}+\{A^n(V_{in}-V_{ref})/2\}$. Similarly, the voltage at the input terminal of the second inverter 6 (i.e. at point 5) becomes $V_{LT}+(A^{n-1}(V_{in}-V_{ref})/2\}$, and the voltage at the output terminal of the inverter 6 (i.e. at point 6) becomes $V_{LT}-\{A^n(V_{in}-V_{ref})/2\}$. In other words, the voltages at points 2, 3, 5, and 6 approach either the supply voltage $V_{pp}$ or the ground voltage GND as time progresses. Also, in the equations above, the variable "n" denotes an integer greater than or equal to two which increases by two each time a feedback operation is performed.

As in the case of the previous embodiment, the voltage comparison result (i.e. the voltage output from the output terminal 14 or 15) indicating the relationship between the input voltage $V_{in}$ and the reference voltage $V_{ref}$ can be obtained by remaining in the third stage for longer than a certain period of time. However, in the third stage, the switch 9 is closed, and thus, the first and second capacitors 3 and 4 are connected as load capacitors for the first and second inverters 5 and 6, respectively. Therefore, a relatively long period of time is required to obtain the voltage comparison result.

Figure 12D:
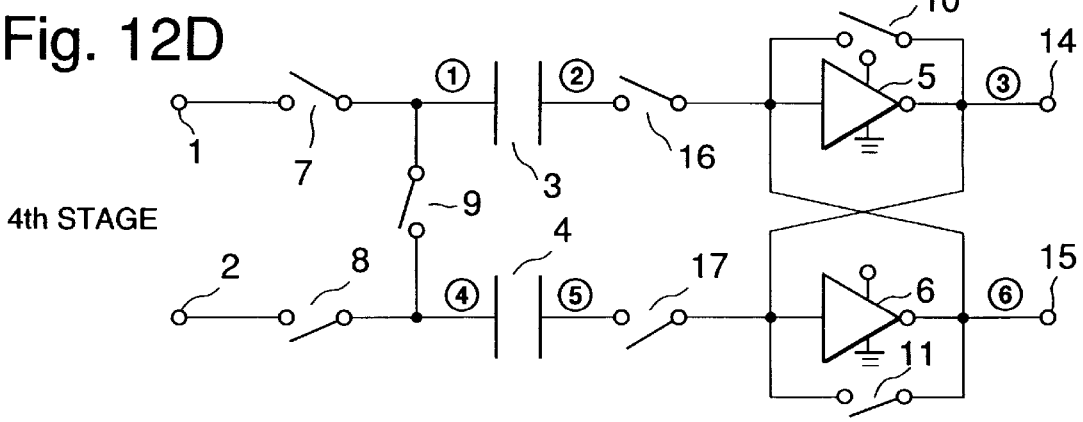
FIG. 12D shows a circuit diagram of a voltage comparator according to another embodiment when the voltage comparator is in a fourth operational state.

Therefore, in order to speed up the voltage comparison, the switch 9 is opened during the fourth stage (FIG. 12D). By opening the switch 9, the capacitors 5 and 6 do not act as load capacitors for the latch circuit formed by the inverters 5 and 6, and the speed of the feedback operation performed by the latch circuit is increased. Also, in contrast with the conventional voltage comparator, the voltage comparator of the present embodiment is not affected by common-mode noise such as a power supply noise for the reasons which are presented above in conjunction with the previous embodiment.

In the embodiments described above, the various switches can be implemented via transistors, and the control signals P1 to P3 can be supplied to the gates of the transistors. Also, each switch can be implemented by P-MOS and N-MOS transistors coupled in parallel such that their sources and drains are connected in common. Also, a control signal (e.g. P1) can be supplied to the gate of the P-MOS (or NMOS) transistor, and the complement of the signals (e.g. P1) can be supplied to the gate of the N-MOS (or P-MOS) transistor.

In the examples described above, the input voltage $V_{in}$ is greater than the reference voltage $V_{ref}$. However, from the various expressions and variables used to represent the voltages at the various points of circuit diagram of the voltage comparator, one skilled in the art will readily recognize that the voltage comparator will still output a correct voltage comparison result when the input voltage $V_{in}$ is less than the reference voltage $V_{ref}$.

Also, in the voltage comparator of the present embodiment, the input voltage $V_{in}$ and the reference voltage $V_{ref}$ are simultaneously sampled by the capacitors 3 and 4, respectively, and processed at the same time. Therefore, a very reliable comparison result is obtained regardless of any fluctuation of the threshold voltage $V_{LT}$ due to a common-mode noise.

Furthermore, according to the voltage comparator of present embodiment, the inputs and outputs of the two inverters 5 and 6 are connected in a crossed manner in order to repeatedly amplify the voltage comparison result. This novel configuration requires only two inverters to enhance the accuracy with which the voltages $V_{in}$ and $V_{ref}$ are compared and to provide a voltage comparison result having a desired logic level. Thus, the amount of power consumed by the voltage comparator is dramatically less than the power consumed by the convention voltage comparator.

The previous description of the preferred embodiments is provided to enable a person skilled in the art to make or use the present invention. Moreover, various modifications to these embodiments will be readily apparent to those skilled in the art, and the generic principles defined herein may be applied to other embodiments without the use of inventive faculty. Therefore, the present invention is not intended to be limited to the embodiments described herein but is to be accorded the widest scope as defined by the claims.

What is claimed:

1. A differential input chopper-type voltage comparator for comparing an input voltage signal and a reference voltage signal and outputting a comparison result, comprising:

an input voltage terminal which inputs said input voltage signal;

a reference voltage terminal which inputs said reference voltage signal;

a comparing circuit which is coupled to said input voltage terminal and said reference voltage terminal, which simultaneously inputs said input voltage signal and said reference voltage signal, and which simultaneously processes said input voltage signal and said reference voltage signal, wherein said comparing circuit generates and outputs a first predetermined voltage signal as said comparison result if said input voltage signal is greater than said reference voltage signal, wherein said comparing circuit generates and outputs a second predetermined voltage signal as said comparison result if said input voltage signal is less than said reference voltage signal and wherein said comparing circuit comprises:
a sampling circuit connected to said input voltage terminal and said reference voltage terminal, wherein said sampling circuit selectively and simultaneously inputs said input voltage signal and said reference voltage signal during a first predetermined period to obtain a sampled input voltage signal and a sampled reference voltage signal;
a voltage processing circuit which is connected to said sampling circuit, which generates a first voltage signal by subtracting said sampled reference voltage signal from said sampled input voltage signal to obtain a first result and dividing said first result by a predetermined number, and which generates a second voltage signal by subtracting said sampled input voltage signal from said sampled reference voltage signal to obtain a second result and dividing said second result by said predetermined number;
an amplifying and latch circuit, which is connected to said voltage processing circuit and which comprises a first gate circuit and a second gate circuit,
wherein said first gate circuit amplifies and inverts said first voltage signal to generate a first current amplified voltage during said second predetermined period following said first predetermined period,
wherein said second gate circuit amplifies and inverts said second voltage signal to generate a second current amplified voltage during said second predetermined period,
wherein said first gate circuit amplifies and inverts said second current amplified voltage to produce a first new amplified voltage during a third predetermined period following said second predetermined period,
wherein said second gate circuit inverts and amplifies said first current amplified voltage to generate a second new amplified voltage during said third predetermined period, and
wherein said first new amplified voltage correspond to said comparison result.

2. The voltage comparator as claimed in claim 1, wherein said first gate circuit repeatedly inputs said second new amplified voltage as said second current amplified voltage and inverts and amplifies said second current amplified voltage as said first new amplified voltage during said third predetermined period, and
wherein said second gate circuit repeatedly inputs said first new amplified voltage as said first current amplified voltage and inverts and amplifies said first current amplified voltage as said second new amplified voltage during said third predetermined period.

3. The voltage comparator as claimed in claim 1, wherein said sampling circuit comprises:
a first switch having a primary first switch terminal and a secondary first switch terminal, wherein said primary first switch terminal is connected to said input voltage terminal and inputs said input voltage signal during said first predetermined period to output said sampled input voltage signal; and
a second switch having a primary second switch terminal and a secondary second switch terminal, wherein said primary second switch terminal is connected to said reference voltage terminal and inputs said reference voltage signal during said first predetermined period to output said sampled reference voltage signal.

4. The voltage comparator as claimed in claim 1, wherein said voltage processing circuit comprises:

a first capacitor having a primary first capacitor terminal and a secondary first capacitor terminal, wherein said primary first capacitor terminal is connected to said sampling circuit and inputs said sampled input voltage signal during said first predetermined period; and
a second capacitor having a primary second capacitor terminal and a secondary second capacitor terminal, wherein said primary second capacitor terminal is connected to said sampling circuit and inputs said sampled reference voltage signal during said first predetermined period; and
a first switch connected between said primary first capacitor terminal and said primary second capacitor terminal,
wherein said first switch is conductive during said second predetermined time to generate said first voltage signal at said secondary first capacitor terminal by effectively subtracting said sampled reference voltage signal from said sampled input voltage signal to obtain said first result and effectively dividing said first result by two and to generate said second voltage signal at said secondary second capacitor terminal by effectively subtracting said sampled input voltage signal from said sampled reference voltage signal to obtain said second result and effectively dividing said second result by two.

5. The voltage comparator as claimed in claim 1, wherein said first gate circuit comprises a first inverter having a first inverter input terminal and a first inverter output terminal, wherein said first inverter input terminal is connected to said voltage processing circuit and inputs said first voltage signal,
wherein said second gate circuit comprises a second inverter having a second inverter input terminal and a second inverter output terminal, wherein said second inverter input terminal is connected to said voltage processing circuit and inputs said second voltage signal,
wherein said amplifying and latch circuit further comprises:
a first switch having a primary first switch terminal and a secondary first switch terminal; and
a second switch having a primary second switch terminal and a secondary second switch terminal,
wherein said primary first switch terminal is connected to said first inverter input terminal and said secondary first switch terminal is connected to said second inverter output terminal,
wherein said primary second switch terminal is connected to said first inverter output terminal and said secondary second switch terminal is connected to said second inverter input terminal,
wherein said first switch and said second switch are non-conductive during said second predetermined period of time and are conductive during said third predetermined period of time,
wherein said first inverter outputs said first new amplified voltage via said first inverter output terminal, and
wherein said second inverter outputs said second new amplified voltage via said second inverter output terminal.

6. The voltage comparator as claimed in claim 5, wherein said amplifying and latch circuit further comprises:
a third switch connected between said first inverter input terminal and said first inverter output terminal; and a fourth switch connected between said second inverter input terminal and said second inverter output terminal, wherein said third and fourth switches are conductive during said first predetermined period and non-conductive during said second predetermined period and said third predetermined period.

7. The voltage comparator as claimed in claim 5, wherein said sampling circuit comprises:

a third switch having a primary third switch terminal and a secondary third switch terminal, wherein said primary third switch terminal is connected to said input voltage terminal and inputs said input voltage signal during said first predetermined period to output said sampled input voltage signal; and a fourth switch having a primary fourth switch terminal and a secondary fourth switch terminal, wherein said primary fourth switch terminal is connected to said reference voltage terminal and inputs said reference voltage signal during said first predetermined period to output said sampled reference voltage signal.

8. The voltage comparator as claimed in claim 7, wherein said voltage processing circuit comprises:

a first capacitor having a primary first capacitor terminal and a secondary first capacitor terminal, wherein said primary first capacitor terminal is connected to said secondary third switch terminal and inputs said sampled input voltage signal during said first predetermined period; and a second capacitor having a primary second capacitor terminal and a secondary second capacitor terminal, wherein said primary second capacitor terminal is connected to said secondary fourth switch terminal and inputs said sampled reference voltage signal during said first predetermined period; and a fifth switch connected between said primary first capacitor terminal and said primary second capacitor terminal, wherein said fifth switch is conductive during said second predetermined period to generate said first voltage signal at said secondary first capacitor terminal by effectively subtracting said sampled reference voltage signal from said sampled input voltage signal to obtain said first result and effectively dividing said first result by two and to generate said second voltage signal at said secondary second capacitor terminal by effectively subtracting said sampled input voltage signal from said sampled reference voltage signal to obtain said second result and effectively dividing said second result by two.

9. The voltage comparator as claimed in claim 8, wherein said amplifying and latch circuit further comprises:

a sixth switch connected between said first inverter input terminal and said first inverter output terminal; and a seventh switch connected between said second inverter input terminal and said second inverter output terminal, wherein said sixth and seventh switches are conductive during said first predetermined period and non-conductive during said second predetermined period and said third predetermined period.

10. The voltage comparator as claimed in claim 9, wherein said first switch and said second switch are conductive during a fourth predetermined period following said third predetermined time, and wherein said third to said seventh switches are non-conductive during said fourth predetermined period.

11. The voltage comparator as claimed in claim 9, wherein said third, fourth, sixth, and seventh switches are conductive during said first predetermined period and said first, second, and fifth switches are non-conductive during said first predetermined period, wherein said fifth switch is conductive during said second predetermined period and said first to fourth and sixth to seventh switches are non-conductive during said second predetermined period, wherein said first, second, and fifth switches are conductive during said third predetermined period and said third, fourth, sixth, and seventh switches are non-conductive during said third predetermined period.

12. The voltage comparator as claimed in claim 11, wherein said first switch and said second switch are conductive during a fourth predetermined period following said third predetermined period, and wherein said third to said seventh switches are non-conductive during said fourth predetermined period.

13. The voltage comparator as claimed in claim 11, further comprising:

a driving circuit which generates a first drive signal, a second drive signal, and a third drive signal, wherein an active state of said first drive signal makes said third, fourth, sixth, and seventh switches conductive and an inactive state of said first drive signal makes said third, fourth, sixth, and seventh switches non-conductive, wherein an active state of said second drive signal makes said fifth switch conductive and an inactive state of said second drive signal makes said fifth switch non-conductive, wherein an active state of said third drive signal makes said first and second switches conductive and an inactive state of said third drive signal makes said first and second switches non-conductive, wherein said first drive signal is in said active state during said first predetermined period and is in said inactive state during said second to third predetermined periods, wherein said second drive signal is in said active state during said second and third predetermined periods and is in said inactive state during said first predetermined period, and wherein said third drive signal is in said active state during said third predetermined period and is in said inactive state during said first and second predetermined periods.

14. The voltage comparator as claimed in claim 13, wherein said first drive signal is in said inactive state during a fourth predetermined period following said third predetermined period, wherein said second drive signal is in said inactive state during said fourth predetermined period, and wherein said third drive signal is in said active state during said fourth predetermined period.

15. A voltage comparator for comparing an input voltage signal and a reference voltage signal and outputting a comparison result, comprising:

a first gate circuit;

a second gate circuit;

a first switch connected between an input terminal of said first gate circuit and an output terminal of said second gate circuit; and a second switch connected between an output terminal of said first gate circuit and an input terminal of said second gate circuit, wherein said first and second switches are non-conductive during a first predetermined period, wherein said first gate circuit inputs, amplifies, and inverts a first voltage signal to produce a current first amplified signal during said first predetermined period of time, wherein said second gate circuit inputs, amplifies, and inverts a second voltage signal to produce a current second amplified signal during said first predetermined period of time, wherein said first and second voltage signals are at least indirectly based on said input voltage signal and said reference voltage signal, wherein said first and second switches are conductive during a second predetermined period following said first predetermined period, wherein said first gate circuit inputs, amplifies, and inverts said current second amplified signal to produce a new first amplified signal, wherein said second gate circuit inputs, amplifies, and inverts said current first amplified signal to produce a new second amplified signal, and wherein said new first amplified signal corresponds to said comparison result, and further comprising:

a voltage processing circuit which inputs a sampled input voltage signal and a sampled reference voltage signal during a third predetermined period which precedes said first predetermined period, wherein said sampled input voltage signal and said sampled reference voltage signal respectively correspond to said input voltage signal and said reference voltage signal, wherein said voltage processing circuit generates said first voltage signal by subtracting said sampled reference voltage signal from said sampled input voltage signal to obtain a first result and dividing said first result by a predetermined number, and wherein said voltage processing circuit generates said second voltage signal by subtracting said sampled input voltage signal from said sampled reference voltage signal to obtain a second result and dividing said second result by said predetermined number.

16. The voltage comparator as claimed in claim 15, wherein said voltage comparator further comprises:

a sampling circuit which is at least indirectly connected to said first and second gate circuits, wherein said sampling circuit selectively and simultaneously inputs said input voltage signal and said reference voltage signal during a third predetermined period which precedes said first predetermined period to obtain a sampled input voltage signal and a sampled reference voltage signal, and wherein said first and second voltage signals are at least indirectly based on said sampled input voltage signal and said sampled reference voltage signal.

17. The voltage comparator as claimed in claim 16, wherein said sampling circuit comprises:

a third switch which inputs said input voltage signal and outputs said input voltage signal as said sampled input voltage signal during said third predetermined period, and a fourth switch which inputs said reference voltage signal and outputs said reference voltage signal as said sampled reference voltage signal during said third predetermined period.

18. The voltage comparator as claimed in claim 15, wherein said voltage processing circuit comprises:

a first capacitor which inputs said sampled input voltage signal during said first predetermined period; and a second capacitor which inputs said sampled reference voltage signal during said first predetermined period; and a third switch connected between an input terminal of said first capacitor and an input terminal of said second capacitor, wherein said third switch is conductive during said first predetermined period to generate said first voltage signal at an output terminal of said first capacitor by effectively subtracting said sampled reference voltage signal from said sampled input voltage signal to obtain said first result and effectively dividing said first result by two, and wherein said third switch is conductive during said first predetermined period to generate said second voltage signal at an output terminal of said second capacitor by effectively subtracting said sampled input voltage signal from said sampled reference voltage signal to obtain said second result and effectively dividing said second result by two.

19. The voltage comparator as claimed in claim 15, further comprising:

a third switch connected between said input terminal and said output terminal of said first inverter; and a fourth switch connected between said input terminal and said output terminal of said second inverter, wherein said third and fourth switches are conductive during a third predetermined period which precedes said first predetermined period and are non-conductive during said first predetermined period and said second predetermined period.

20. The voltage comparator as claimed in claim 17, further comprising:

a voltage processing circuit which inputs said sampled input voltage signal and said sampled reference voltage signal during said third predetermined period, wherein said voltage processing circuit generates said first voltage signal by subtracting said sampled reference voltage signal from said sampled input voltage signal to obtain a first result and dividing said first result by a predetermined number, and wherein said voltage processing circuit generates said second voltage signal by subtracting said sampled input voltage signal from said sampled reference voltage signal to obtain a second result and dividing said second result by a predetermined number.

21. The voltage comparator as claimed in claim 20, wherein said voltage processing circuit comprises:

a first capacitor which inputs said sampled input voltage signal during said first predetermined period; and a second capacitor which inputs said sampled reference voltage signal during said first predetermined period; and a fifth switch connected between an input terminal of said first capacitor and an input terminal of said second capacitor, wherein said fifth switch is conductive during said first predetermined period to generate said first voltage signal at an output terminal of said first capacitor by effectively subtracting said sampled reference voltage signal from said sampled input voltage signal to obtain said first result and effectively dividing said first result by two, and wherein said fifth switch is conductive during said first predetermined period to generate said second voltage signal at an output terminal of said second capacitor by effectively subtracting said sampled input voltage signal from said sampled reference voltage signal to obtain said second result and effectively dividing said second result by two.

22. The voltage comparator as claimed in claim 21, further comprising:

a sixth switch connected between said input terminal and said output terminal of said first inverter; and a seventh switch connected between said input terminal and said output terminal of said second inverter, wherein said sixth and seventh switches are conductive during said second predetermined period and are non-conductive during said first predetermined period and said third predetermined period.

23. The voltage comparator as claimed in claim 22, further comprising:

a driving circuit which generates a first drive signal, a second drive signal, and a third drive signal, wherein an active state of said first drive signal makes said third, fourth, sixth, and seventh switches conductive and an inactive state of said first drive signal makes said third, fourth, sixth, and seventh switches non-conductive, wherein an active state of said second drive signal makes said fifth switch conductive and an inactive state of said second drive signal makes said fifth switch non-conductive, wherein an active state of said third drive signal makes said first and second switches conductive and an inactive state of said third drive signal makes said first and second switches non-conductive, wherein said first drive signal is in said active state during said third predetermined period and is in said inactive state during said first and second predetermined periods, wherein said second drive signal is in said active state during said first and second predetermined periods and is in said inactive state during said third predetermined period, and wherein said third drive signal is in said active state during said second predetermined period and is in said inactive state during said first and third predetermined periods.

24. The voltage comparator as claimed in claim 23, wherein said first drive signal is in said inactive state during a fourth predetermined period following said second predetermined period, wherein said second drive signal is in said inactive state during said fourth predetermined period, and wherein said third drive signal is in said active state during said fourth predetermined period.

25. The voltage comparator as claimed in claim 24, further comprising:

an inverted output terminal which outputs said new second amplified signal to produce said comparison result.

26. A voltage comparing method, comprising the steps of:

(a) sampling an input voltage signal to obtain a sampled input voltage signal and sampling a reference voltage signal to obtain a sampled reference voltage signal;

(b) obtaining a first voltage signal based on said sampled input voltage signal and said sampled reference voltage signal and obtaining a second voltage signal based on said sampled input voltage signal and said sampled reference voltage signal;

(c) amplifying and inverting said first voltage signal to produce an amplified first voltage signal;

(d) amplifying and inverting said second voltage signal to produce an amplified second voltage signal; and (e) supplying said amplified first voltage signal and said amplified second signal to a latch circuit which outputs a comparison result based on a first voltage of said first voltage signal and a second voltage of said second voltage signal wherein said step (b) comprises the steps of:

(b1) inputting said sampled input voltage signal and said sampled reference voltage signal; and (b2) obtaining a first difference voltage by subtracting said sampled reference voltage signal from said sampled input voltage signal and obtaining said first voltage signal by dividing said first difference voltage by a predetermined number and obtaining a second difference voltage by subtracting said sampled input voltage signal from said sampled reference voltage signal and obtaining said second voltage signal by dividing said second difference voltage by said predetermined number, wherein at least a portion of said step (b) is preformed during a first predetermined period, and wherein at least a portion of said step (e) is performed during a second predetermined period which follows said first predetermined period, and wherein said step (b1) comprises the steps of:

(b1a) inputting said sampled input voltage signal via an input terminal of a first capacitor during said first predetermined period; and (b1b) inputting said sampled reference voltage signal via an input terminal of a second capacitor during said first predetermined period, wherein said step (b2) comprises the steps of:

(b2a) making a third switch connected between said input terminals of said first and second capacitors conductive during a third predetermined period which follows said first predetermined period and precedes said second predetermined period;

(b2b) effectively subtracting said sampled reference voltage signal from said sampled input voltage signal to obtain said first difference value when said third switch is conductive;

(b2c) obtaining said first voltage signal by effectively dividing said first difference voltage by two when said third switch is conductive;

(b2d) outputting said first voltage signal via an output terminal of said first capacitor when said third switch is conductive;

(b2e) effectively subtracting said sampled input voltage signal from said sampled reference voltage signal to obtain said second difference value when said third switch is conductive;

(b2f) obtaining said second voltage signal by effectively dividing said second difference voltage by two when said third switch is conductive; and (b2g) outputting said second voltage signal via an output terminal of said second capacitor when said third switch is conductive.

27. The voltage comparing method as claimed in claim 26, wherein said step (a) is preformed during a first predetermined period, wherein at least a portion of said step (b), said step (c), and said step (d) is performed at a second predetermined period following said first predetermined period of time, and wherein at least a portion of said step (f) is performed during a third predetermined period of time following said second predetermined period.

28. The voltage comparing method as claimed in claim 26, wherein said step (a) comprises the steps of:
(a1) simultaneously and individually receiving said input voltage signal and said reference voltage signal and simultaneously sampling said input voltage signal and said reference voltage signal to produce said sampled input voltage signal and said sampled reference voltage signal.

29. The voltage comparing method as claimed in claim 28, wherein said step (a1) is performed during a first predetermined period, and wherein at least a portion of said step (f) is performed during a second predetermined period which follows said first predetermined period.

30. The voltage comparing method as claimed in claim 29, wherein said step (a1) comprises the steps of:
(a1a) inputting said input voltage signal to a first switch;
(a1b) inputting said reference voltage signal to a second switch when said input voltage signal is input to said first switch;
(a1c) making said first switch conductive during said first predetermined period so that said first switch outputs said input voltage signal as said sampled input voltage signal; and
(a1d) making said second switch conductive during said first predetermined period so that said second switch outputs said reference voltage signal as said sampled reference voltage signal.

31. The voltage comparing method as claimed in claim 26, wherein said step (c) comprises the steps of:
(c1) amplifying and inverting said first voltage signal via a first gate circuit to produce said amplified first voltage signal, and
wherein said step (d) comprises the steps of:
(d1) amplifying and inverting said second voltage signal via a second gate circuit to produce said amplified second voltage signal.

32. The voltage comparing method as claimed in claim 31, wherein said steps (c) and (d) are performed during a first predetermined period, and wherein at least a portion of said step (e) is performed during a second predetermined period following said first predetermined period.

33. The voltage comparing method as claimed in claim 32, wherein said step (e) comprises the steps of:
(e1) making a first switch connected between an input terminal of said first gate circuit and an output terminal of said second gate circuit conductive during said second predetermined period; and
(e2) making a second switch connected between an output terminal of said first gate circuit and an input terminal of said second gate circuit conductive during said second predetermined period; and
(e3) outputting said comparison result from at least one of said output terminal of said first gate circuit and said output terminal of said second gate circuit.

34. The voltage comparing method as claimed in claim 30, wherein said step (c) comprises the steps of:
(c1) amplifying and inverting said first voltage signal via a first gate circuit to produce said amplified first voltage signal, and
wherein said step (d) comprises the steps of:
(d1) amplifying and inverting said second voltage signal via a second gate circuit to produce said amplified second voltage signal.

35. The voltage comparing method as claimed in claim 34, wherein said steps (c) and (d) are performed during said third predetermined period.

36. The voltage comparing method as claimed in claim 35, wherein said step (e) comprises the steps of:
(e1) making a fourth switch connected between an input terminal of said first gate circuit and an output terminal of said second gate circuit conductive during said second predetermined period; and
(e2) making a fifth switch connected between an output terminal of said first gate circuit and an input terminal of said second gate circuit conductive during said second predetermined period; and
(e3) outputting said comparison result from at least one of said output terminal of said first gate and said output terminal of said second gate circuit.

37. The voltage comparing method as claimed in claim 36, further comprising the steps of:
(f) making a sixth switch connected between said input terminal of said first gate circuit and said output terminal of said first gate circuit conductive during said first predetermined period and making said sixth switch non-conductive during said second predetermined period and said third predetermined period; and
(g) making a seventh switch connected between said input terminal of said second gate circuit and said output terminal of said second gate circuit conductive during said first predetermined period and making said seventh switch non-conductive during said second predetermined period and said third predetermined period.

38. The voltage comparing method as claimed in claim 37, further comprising the steps of:
(h) making said third switch non-conductive during a fourth predetermined period following said second predetermined period.

39. A voltage comparator for comparing an input voltage signal and a reference voltage signal and outputting a comparison result, comprising:
a first gate circuit;
a second gate circuit, wherein an input terminal of said second gate circuit is connected to an output terminal of said first gate circuit and an output terminal of said second gate circuit is connected to an input terminal of said first gate circuit;
a first switch connected between said input terminal of said first gate circuit and said output terminal of said first gate circuit; and
a second switch connected between said input terminal of said second gate circuit and said output terminal of said second gate circuit,
wherein said first and second switches are conductive during a first predetermined period
wherein said first and second switches are non-conductive during a second predetermined period following said first predetermined period,
wherein said first gate circuit inputs, amplifies, and inverts a first voltage signal to produce a current first amplified signal during said second predetermined period of time, wherein said second gate circuit inputs, amplifies, and inverts a second voltage signal to produce a current second amplified signal during said second predetermined period of time, wherein said first and second voltage signals are at least indirectly based on said input voltage signal and said reference voltage signal, wherein said first gate circuit inputs, amplifies, and inverts said current second amplified signal to produce a new first amplified signal during said second predetermined period, wherein said second gate circuit inputs, amplifies, and inverts said current first amplified signal to produce a new second amplified signal during said second predetermined period, and wherein said new first amplified signal corresponds to said comparison result, and further comprising:

a voltage processing circuit which inputs a sampled input voltage signal and a sampled reference voltage signal during said first predetermined period, wherein said sampled input voltage signal and said sampled reference voltage signal respectively correspond to said input voltage signal and said reference voltage signal, wherein said voltage processing circuit generates said first voltage signal by subtracting said sampled reference voltage signal from said sampled input voltage signal to obtain a first result and dividing said first result by a predetermined number during a third predetermined period which follows said first predetermined period and precedes said second predetermined period, and wherein said voltage processing circuit generates said second voltage signal by subtracting said sampled input voltage signal from said sampled reference voltage signal to obtain a second result and dividing said second result by said predetermined number during said third predetermined period.

40. The voltage comparator as claimed in claim 39, wherein said voltage comparator further comprises:

a sampling circuit which is at least indirectly connected to said first and second gate circuits, wherein said sampling circuit selectively and simultaneously inputs said input voltage signal and, said reference voltage signal during said first predetermined period to obtain a sampled input voltage signal and a sampled reference voltage signal, and wherein said first and second voltage signals are at least indirectly based on said sampled input voltage signal and said sampled reference voltage signal.

41. The voltage comparator as claimed in claim 40, wherein said sampling circuit comprises:

a third switch which inputs said input voltage signal and outputs said input voltage signal as said sampled input voltage signal during said first predetermined period, and a fourth switch which inputs said reference voltage signal and outputs said reference voltage signal as said sampled reference voltage signal during said first predetermined period.

42. The voltage comparator as claimed in claim 39, wherein said voltage processing circuit comprises:

a first capacitor which inputs said sampled input voltage signal during said first predetermined period; and a second capacitor which inputs said sampled reference voltage signal during said first predetermined period; and a third switch connected between an input terminal of said first capacitor and an input terminal of said second capacitor, wherein said third switch is conductive during said third predetermined period to generate said first voltage signal at an output terminal of said first capacitor by effectively subtracting said sampled reference voltage signal from said sampled input voltage signal to obtain said first result and effectively dividing said first result by two, and wherein said third switch is conductive during said third predetermined period to generate said second voltage signal at an output terminal of said second capacitor by effectively subtracting said sampled input voltage signal from said sampled reference voltage signal to obtain said second result and effectively dividing said second result by two.

43. The voltage comparator as claimed in claim 42, wherein said voltage comparator further comprises:

a sampling circuit which selectively and simultaneously inputs said input voltage signal and said reference voltage signal during said first predetermined period, wherein said sampling circuit comprises:

a fourth switch which inputs said input voltage signal and outputs said input voltage signal as said sampled input voltage signal during said first predetermined period, and a fifth switch which inputs said reference voltage signal and outputs said reference voltage signal as said sampled reference voltage signal during said first predetermined period.

44. The voltage comparator as claimed in claim 43, further comprising:

a sixth switch connected between said input terminal of said first inverter and said output terminal of said first capacitor; and a seventh switch connected between said input terminal of said second inverter and said output terminal of said second capacitor, wherein said sixth and seventh switches are conductive during said first and second predetermined periods and are non-conductive during said third predetermined period.

45. The voltage comparator as claimed in claim 44, further comprising:

a driving circuit which generates a first drive signal, a second drive signal, and a third drive signal, wherein an active state of said first drive signal makes said first, second, fourth, and fifth switches conductive and an inactive state of said first drive signal makes said first, second, fourth, and fifth switches non-conductive, wherein an active state of said second drive signal makes said third switch conductive and an inactive state of said second drive signal makes said third switch non-conductive, wherein an active state of said third drive signal makes said sixth and seventh switches conductive and an inactive state of said third drive signal makes said sixth and seventh switches non-conductive, wherein said first drive signal is in said active state during said first predetermined period and is in said inactive state during said second and third predetermined periods, wherein said second drive signal is in said active state during said second and third predetermined periods and is in said inactive state during said first predetermined period, and wherein said third drive signal is in said active state during said first and third predetermined periods and is in said inactive state during said second predetermined period.

46. The voltage comparator as claimed in claim 45, wherein said first, second, and third drive signals are in said inactive state during a fourth predetermined period following said third predetermined period.

47. A voltage comparing method for comparing an input voltage signal and a reference voltage signal and outputting a comparison result, comprising the steps of:

(a) inputting a first voltage signal to a first gate circuit during a first predetermined period;

(b) inputting a second voltage signal to a second gate circuit during said first predetermined period, wherein an input terminal of said second gate circuit is connected to an output terminal of said first gate circuit, an output terminal of said second gate circuit is connected to an input terminal of said first gate circuit, a first switch is connected between said input terminal of said first gate circuit and said output terminal of said first gate circuit, and a second switch connected between said input terminal of said second gate circuit and said output terminal of said second gate circuit, and wherein said first and second voltage signals are at least indirectly based on said input voltage signal and said reference voltage signal;

(c) making said first and second switches conductive during a second predetermined period which precedes said first predetermined period, (d) making said first and second switches non-conductive during said first predetermined period;

(e) amplifying and inverting said first voltage signal via said first gate circuit to produce a current first amplified signal during said first predetermined period of time; and (f) amplifying and inverting said second voltage signal via said second gate circuit to produce a current second amplified signal during said first predetermined period of time, (g) inputting, amplifying, and inverting said current second amplified signal via said first gate circuit to produce a new first amplified signal during said first predetermined period;

(h) inputting, amplifying, and inverting said current first amplified signal via said second gate circuit to produce a new second amplified signal during said first predetermined period, wherein said new first amplified signal corresponds to said comparison result, (i) sampling an input voltage signal and a sampled reference voltage signal during said second predetermined period, wherein said sampled input voltage signal and said sampled reference voltage signal respectively correspond to said input voltage signal and said reference voltage signal, and (j) generating said first voltage signal by subtracting said sampled reference voltage signal from said sampled input voltage signal to obtain a first result and dividing said first result by a predetermined number during a third predetermined period which follows said second predetermined period and precedes said first predetermined period and generating said second voltage signal by subtracting said sampled input voltage signal from said sampled reference voltage signal to obtain a second result and dividing said second result by a predetermined number during said third predetermined period.

48. The method as claimed in claim 47, wherein said step (j) comprises the steps of:

(j1) inputting said sampled input voltage signal to a first capacitor during said second predetermined period; and (j2) inputting said sampled reference voltage signal to a second capacitor during said second predetermined period; and (j3) making a third switch connected between an input terminal of said first capacitor and an input terminal of said second capacitor conductive during said third predetermined period to generate said first voltage signal at an output terminal of said first capacitor and to generate said second voltage signal at an output terminal of said second capacitor.

49. The method as claimed in claim 48, further comprising the steps of:

(k) making a fourth switch connected between said input terminal of said first inverter and said output terminal of said first capacitor conductive during said first and second predetermined periods and non-conductive during said third predetermined period; and (l) making a fifth switch connected between said input terminal of said second inverter and said output terminal of said second capacitor conductive during said first and second predetermined periods and non-conductive during said third predetermined period.

50. The method as claimed in claim 49, further comprising the step of:

(m) making said first to fifth switches non-conductive during a fourth predetermined period following said first predetermined period.

51. The apparatus as claimed in claim 13, wherein said first to seventh switches respectively comprise first to seventh transistors, wherein said first drive signal is input to a gate of said third, fourth, sixth, and seventh transistors, said second drive signal is input to a gate of said fifth transistor, and said third drive signal is input to a gate of said first and second transistors.

52. The apparatus as claimed in claim 13, wherein said first to seventh switches respectively comprise first to seventh P-MOS and N-MOS transistors connected in parallel, wherein said first drive signal is input to gates of said third, fourth, sixth, and seventh N-MOS transistors and a complement of said first drive signal is input to gates of said third, fourth, sixth, and seventh P-MOS transistors, wherein said second drive signal is input to a gate of said fifth N-MOS transistor and a complement of said second drive signal is input to a gate of said fifth P-MOS transistor, and wherein said third drive signal is input to gates of said first and second N-MOS transistors and a complement of said third drive signal is input to gates of said first and second P-MOS transistors.

53. The apparatus as claimed in claim 23, wherein said first to seventh switches respectively comprise first to seventh transistors, wherein said first drive signal is input to a gate of said third, fourth, sixth, and seventh transistors, said second drive signal is input to a gate of said fifth transistor, and said third drive signal is input to a gate of said first and second transistors.

54. The apparatus as claimed in claim 23, wherein said first to seventh switches respectively comprise first to seventh P-MOS and N-MOS transistors connected in parallel, wherein said first drive signal is input to gates of said third, fourth, sixth, and seventh N-MOS transistors and a complement of said first drive signal is input to gates of said third, fourth, sixth, and seventh P-MOS transistors, wherein said second drive signal is input to a gate of said fifth N-MOS transistor and a complement of said second drive signal is input to a gate of said fifth P-MOS transistor, and wherein said third drive signal is input to gates of said first and second N-MOS transistors and a complement of said third drive signal is input to gates of said first and second P-MOS transistors.

55. The apparatus as claimed in claim 45, wherein said first to seventh switches respectively comprise first to seventh transistors, wherein said first drive signal is input to a gate of said first, second, fourth, and fifth transistors, said second drive signal is input to a gate of said third transistor, and said third drive signal is input to a gate of said sixth and seventh transistors.

56. The apparatus as claimed in claim 45, wherein said first to seventh switches respectively comprise first to seventh P-MOS and N-MOS transistors connected in parallel, wherein said first drive signal is input to gates of said first, second, fourth, and fifth N-MOS transistors and a complement of said first drive signal is input to gates of said first, second, fourth, and fifth P-MOS transistors, wherein said second drive signal is input to a gate of said third N-MOS transistor and a complement of said second drive signal is input to a gate of said third P-MOS transistor, and wherein said third drive signal is input to gates of said sixth and seventh N-MOS transistors and a complement of said third drive signal is input to gates of said sixth and seventh P-MOS transistors.

* * * * *

UNITED STATES PATENT AND TRADEMARK OFFICE
CERTIFICATE OF CORRECTION

PATENT NO.: 6,064,239
DATED: May 16, 2000
INVENTOR(S): Takashi MATSUOKA

It is certified that error(s) appears in the above-identified patent and that said Letters Patent is hereby corrected as shown below:

Column 8, line 35, after "to obtain the voltage" delete "vref" insert --$V_{ref}$--.

line 39, delete the $2^{nd}$ occurrence of "$V_{LT}A$" insert --$V_{LT}$-A--.

Column 9, line 32, delete "$V_{LT}$ {A" insert --$V_{LT}$-A {$A^n$--.

Column 16, line 64, delete "5" insert --1--.

Signed and Sealed this

Tenth Day of April, 2001

Attest:

NICHOLAS P. GODICI

Attesting Officer     Acting Director of the United States Patent and Trademark Office